United States Patent
Hashidzume et al.

(10) Patent No.: US 7,446,381 B2
(45) Date of Patent: Nov. 4, 2008

(54) SEMICONDUCTOR MEMORY DEVICE AND METHOD FOR FABRICATING THE SAME

(75) Inventors: Takahiko Hashidzume, Osaka (JP); Fumihiko Noro, Toyama (JP); Nobuyoshi Takahashi, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 10 days.

(21) Appl. No.: 11/151,542

(22) Filed: Jun. 14, 2005

(65) Prior Publication Data
US 2006/0022243 A1    Feb. 2, 2006

(30) Foreign Application Priority Data
Jul. 28, 2004    (JP)    ............... 2004-219607

(51) Int. Cl.
*H01L 29/72* (2006.01)
(52) U.S. Cl. ............... 257/412; 257/384; 257/401; 257/413
(58) Field of Classification Search ......... 257/410–413, 257/384, 401
See application file for complete search history.

(56) References Cited

U.S. PATENT DOCUMENTS

| | | | |
|---|---|---|---|
| 6,326,669 B1 * | 12/2001 | Hwang et al. | ............... 257/384 |
| 6,461,951 B1 * | 10/2002 | Besser et al. | ............... 438/592 |
| 6,630,721 B1 * | 10/2003 | Ligon | ............... 257/413 |
| 6,767,814 B2 * | 7/2004 | Kwon et al. | ............... 438/592 |
| 6,969,886 B1 * | 11/2005 | Park et al. | ............... 257/324 |
| 2003/0057505 A1 * | 3/2003 | Ebina et al. | ............... 257/411 |
| 2003/0222293 A1 | 12/2003 | Noro | |

FOREIGN PATENT DOCUMENTS

| | | | |
|---|---|---|---|
| JP | 2001-53158 | * | 2/2001 |
| JP | 2003-224265 | * | 8/2003 |
| JP | 2003-347511 | | 12/2003 |

OTHER PUBLICATIONS

Chinese Office Action (with English translation) issued in Chinese Patent Application No. CN 200510072638.7, dated May 16, 2008

* cited by examiner

*Primary Examiner*—Edward Wojciechowicz
(74) *Attorney, Agent, or Firm*—McDermott Will & Emery LLP

(57) ABSTRACT

A semiconductor memory device has a memory region which is formed on a semiconductor substrate and in which a plurality of memory cells each including a memory transistor are arranged as a matrix using a plurality of impurity diffusion layers (bit lines) and a plurality of gate electrodes (word lines) intersecting each other. The gate electrode of each of the memory transistors has an upper surface thereof formed into a protruding portion which is higher in level at the middle portion than at the edge portions. A silicide layer is formed on the upper surface of the protruding portion of the gate electrode of each of the memory transistors.

11 Claims, 21 Drawing Sheets

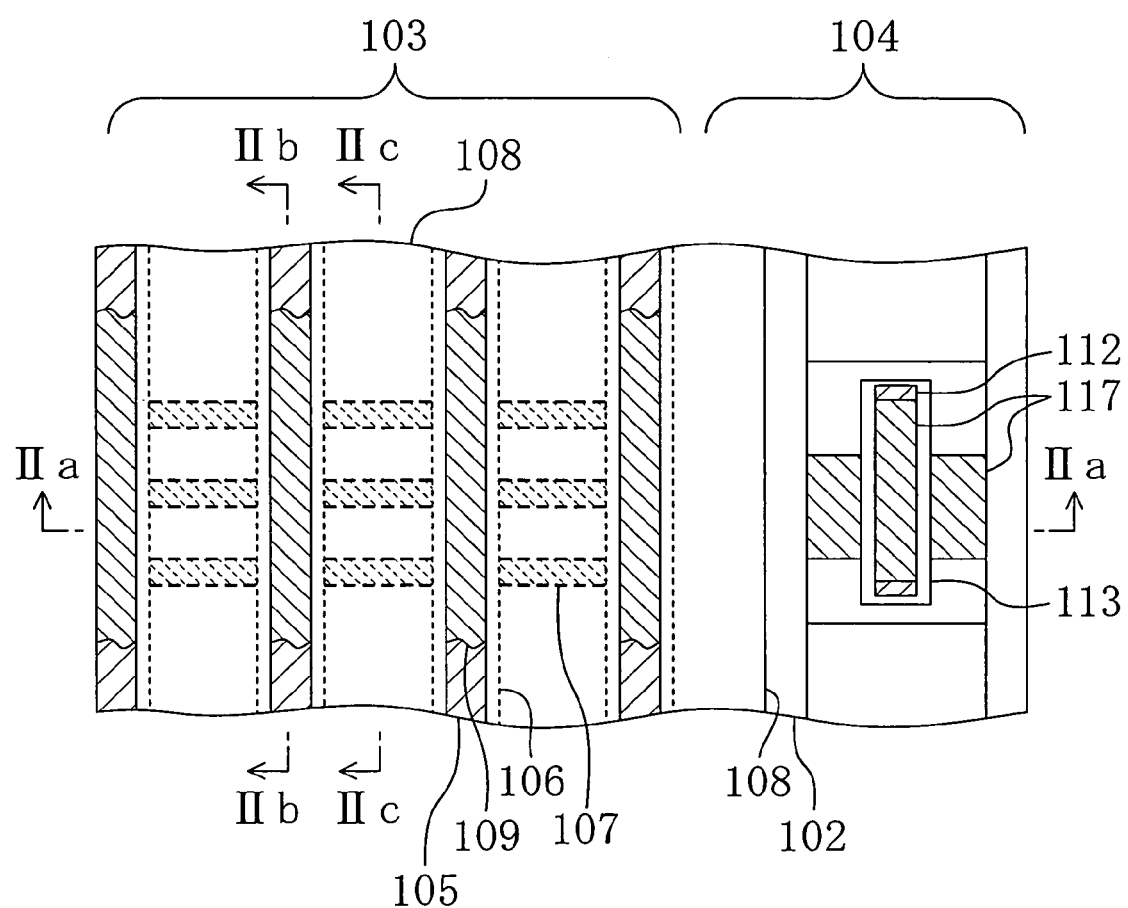

SEMICONDUCTOR MEMORY DEVICE AND METHOD FOR FABRICATING THE SAME

CROSS-REFERENCE TO RELATED APPLICATIONS

The teachings of Japanese Patent Application JP 2004-219607, filed Jul. 28, 2004, are entirely incorporated herein by reference, inclusive of the claims, specification, and drawings.

BACKGROUND OF THE INVENTION

The present invention relates to a semiconductor memory device and a method for fabricating the same and, more particularly, to a semiconductor memory device in which a logic region and a memory region having a diffusion wiring layer structure are embedded and to a method for fabricating the same.

As an electrically writable nonvolatile memory device, there has been known a semiconductor memory device having a structure (virtual ground system) in which a diffusion wiring layer using an impurity diffusion layer formed in a semiconductor substrate as wiring also serves as the source region or drain of a memory transistor.

As ultra-miniaturization, higher integration, higher performance, and higher reliability has been required of semiconductor memory devices in recent years, the semiconductor memory device having the virtual ground system described above has also been required to operate at a higher speed.

A conventional semiconductor memory device in which a memory region having the virtual ground system and a logic region are embedded is disclosed in, e.g., Japanese Laid-Open Patent Publication No. 2003-347511.

As shown in FIG. 2 in the patent publication mentioned above, a silicide layer 109 has been formed by using a salicide technology on the upper surface of the memory gate electrode 105 in a first active region 101 as the memory region, while a silicide layer 115 has been formed by using the salicide technology on the upper surface of each of a logic gate electrode 112 and an impurity diffusion layer 114 in a second active region 102 as the logic region.

However, as the miniaturization of a semiconductor device proceeds and design rules are reduced increasingly, the width of the gate electrode in the memory region is also reduced. Accordingly, a resistance value per unit length of the gate electrode (bar resistance) increases in proportion to the reciprocal of the gate width so that a resistance value per unit length (bar resistance) in a 0.1 µm process becomes ten times the resistance value per unit length in a 1 µm process. Even in a structure in which the upper surface of the gate electrode has been silicidized as in the conventional embodiment, a resistance value per unit length of a gate electrode (bar resistance) increases in proportion to the reciprocal of the gate width. If wires are further thinned, therefore, the structure in which the upper surface of the gate electrode is silicidized leads to the problem that it cannot satisfy both of the requirement for the ultra-miniaturization of a semiconductor device and the requirement for the higher-speed operation thereof. In a gate electrode in the virtual ground system, the dimension of the gate electrode perpendicular to the direction in which the gate electrode extends is termed the gate width.

SUMMARY OF THE INVENTION

In view of the conventional problem described above, it is therefore an object of the present invention to further reduce a gate resistance value under the trend toward a further reduction in the size of a gate electrode or the like in a semiconductor memory device.

To attain the object, the present invention provides a semiconductor memory device with a structure in which the gate electrode of a transistor composing a memory cell is formed to have an upper portion which is configured to protrude upward at the middle portion thereof such that the contact area between the gate electrode and a silicide layer formed on the upper surface of the gate electrode is increased.

Specifically, a semiconductor memory device according to the present invention is a semiconductor memory device having a memory region in which a plurality of memory cells each including a memory transistor are arranged as a matrix using a plurality of bit lines and a plurality of word lines intersecting each other, wherein a gate electrode of each of the memory transistors has an upper surface thereof formed into a protruding portion which is higher in level at a middle portion than at an edge portion and a silicide layer is formed on an upper surface of the protruding portion of the gate electrode of the memory transistor.

In the semiconductor memory device according to the present invention, the silicide layer formed on the upper surface of the gate electrode has a length therealong in the gate width direction which is larger than when the upper surface of the gate electrode is flat. The arrangement increases the contact area between the main body of the gate electrode and the silicide layer formed on the upper surface thereof and reduces the resistance value per unit length of the gate electrode (bar resistance). As a result, the memory transistor can satisfy the requirements for further miniaturization and higher-speed operation.

In the semiconductor memory device according to the present invention, each of the memory transistors preferably has an impurity diffusion layer serving as a source region or drain region and also constituting a part of the corresponding one of the bit lines and has the gate electrode constituting a part of the corresponding one of the word lines. The arrangement can implement a virtual ground system in which a diffusion wiring layer using an impurity diffusion layer as wiring also serves as the source or drain of a memory transistor.

In this case, an inter-gate insulating film is preferably formed on a region of the substrate which is located between the respective gate electrodes of the plurality of memory transistors. The arrangement can prevent, during the formation of the silicide layer, a short circuit between the adjacent impurity diffusion layers (bit lines) due to the silicide layer.

Preferably, the semiconductor memory device according to the present invention further has: a logic region formed on a region of the substrate other than the memory region and in which a logic transistor is disposed, wherein a sidewall insulating film is formed on each side surface of a gate electrode of the logic transistor.

In this case, a silicide layer is preferably formed on each of an upper surface of the gate electrode of the logic transistor and an exposed portion of an impurity diffusion layer serving as a source region or drain region of the logic transistor. The arrangement reduces the resistance value of each of the upper surface of the gate electrode and the source region or drain region even in the logic region and thereby allows higher-speed operation of the logic region.

In the semiconductor memory device according to the present invention, a memory gate insulating film formed under the gate electrode of each of the memory transistors preferably has a charge accumulation film. The arrangement can implement a semiconductor memory element which allows the accumulation of charge in the memory gate insulating film.

In this case, the memory gate insulating film is preferably composed of a multilayer structure having a lower-layer silicon oxide film and an upper-layer silicon nitride film and the charge accumulation film is preferably composed of the upper-layer silicon nitride film.

Alternatively, in this case, the memory gate insulating film is preferably composed of a multilayer structure having a lower-layer silicon oxide film, an intermediate-layer silicon nitride film, and an upper-layer silicon oxide film and the charge accumulation film is preferably composed of the intermediate-layer silicon nitride film.

In the semiconductor memory device according to the present invention, the memory gate insulating film formed under the gate electrode of each of the memory transistors is preferably composed of a multilayer structure having a lower-layer silicon oxide film, an intermediate-layer silicon nitride film, and an upper-layer silicon oxide film and the intermediate-layer silicon nitride film is preferably formed as a common intermediate-layer silicon nitride film connecting the respective memory gate insulating films of the plurality of memory transistors to each other. The arrangement can prevent the silicide layer from being formed on the upper surface of the impurity diffusion layer since the impurity diffusion layer is less likely to be exposed even when an over-etched state is reached during the formation of the inter-gate insulating film.

In the semiconductor memory device according to the present invention, of the plurality of memory transistors, each pair adjacent to each other in a direction in which each of the word lines extends preferably share the common impurity diffusion layer serving as the source region of one of the adjacent pair of memory transistors and also as the drain region of the other thereof. The arrangement can reduce the area of each of the memory cells advantageously for higher integration.

In the semiconductor memory device according to the present invention, when the silicide layer has been formed on each of the upper surface of the gate electrode of the logic transistor and the exposed portion of the impurity diffusion layer serving as the source region or drain region, the silicide layer on the gate electrode of each of the memory transistors and the silicide layer on the gate electrode of the logic transistor preferably have different cross-sectional configurations in a direction perpendicular to a surface of the substrate.

A first method for fabricating a semiconductor device according to the present invention is a method for fabricating a semiconductor memory device having a memory region in which a plurality of memory cells each including a memory transistor are arranged as a matrix using a plurality of bit lines and a plurality of word lines intersecting each other and a logic region in which a logic transistor is disposed, the method comprising the steps of: forming, in the memory region, a first common impurity diffusion layer serving as a source region or drain region of each of the memory transistors composing those of the plurality of memory cells which are arranged in a direction in which each of the bit lines extends such that the first common impurity diffusion layer extends in the direction in which the bit line extends; forming a memory gate insulating film on the memory region of the substrate, while forming a logic gate insulating film on the logic region of the substrate; depositing a silicon-containing film on each of the memory gate insulating film and the logic gate insulating film; patterning the silicon-containing film in the memory region to form the common gate electrode of those of the plurality of memory transistors which are arranged in a direction in which each of the word lines extends such that the common gate electrode extends in the direction in which the word line extends, while patterning the silicon-containing film in the logic region to form the gate electrode of the logic transistor; forming a sidewall insulating film on each side surface of the gate electrode of the logic transistor; forming, in the logic region, a second impurity diffusion layer serving as a source region or drain region of the logic transistor; forming a first insulating film on each of the memory region and the logic region and then forming a second insulating film having a composition different from a composition of the first insulating film on the first insulating film that has been formed; successively performing etching with respect to the second insulating film and the first insulating film in the memory region to expose an edge portion of an upper surface of the gate electrode of each of the plurality of memory transistors; after exposing the edge portion of the upper surface of the gate electrode of each of the plurality of memory transistors, further performing etching to expose the upper surface of the gate electrode of each of the plurality of memory transistors and remove the edge portion of the upper surface of the gate electrode, while forming an inter-gate insulating film composed at least of the first insulating film between the respective gate electrodes of those of the memory transistors which are adjacent to each other in the direction in which each of the bit lines extends; successively performing etching with respect to the second insulating film and the first insulating film in the logic region to expose each of an upper surface of the gate electrode of the logic transistor and an upper surface of the second impurity diffusion layer; and forming a silicide layer on each of the upper surface of the gate electrode of each of the plurality of memory transistors from which the edge portion has been removed, the upper surface of the gate electrode of the logic transistor, and an exposed portion of the second impurity diffusion layer.

Since the first method for fabricating a semiconductor memory device removes the edge portion of the upper surface of the gate electrode of each of the memory transistors, the upper surface of the gate electrode of the memory transistor can be formed into a protruding portion which is higher in level at the middle portion than at the edge portions. Accordingly, the silicide layer having a large contact area can be formed on the upper surface of the gate electrode of each of the memory transistors in the subsequent silicidization step. As a result, the resistance value per unit length of each of the gate electrode (bar resistance) of each of the memory transistors is reduced and the memory transistor can satisfy the requirements for further miniaturization and higher-speed operation. Since the first and second insulating films having different compositions, i.e., different etching resistances are used for an insulating film filling the spaces between the respective gate electrodes of the memory transistors, the insulating film can be deposited to a desired thickness between the gate electrodes of the memory transistors by adjusting the thickness of each of the first and second insulating films, irrespective of the magnitude of the spacing between the gate electrodes. Since it is necessary to expose the second impurity diffusion layer for silicidization in the logic region, compositions which allow easy removal of the first and second insulating films can be selected therefor.

In the first method for fabricating a semiconductor memory device, the memory gate insulating film preferably has a charge accumulation film.

In this case, the memory gate insulating film is preferably composed of a multilayer structure having a lower-layer silicon oxide film and an upper-layer silicon nitride film and the charge accumulation film is preferably composed of the upper-layer silicon nitride film.

In this case, the memory gate insulating film is preferably composed of a multilayer structure having a lower-layer silicon oxide film, an intermediate-layer silicon nitride film, and an upper-layer silicon oxide film and the charge accumulation film is preferably composed of the intermediate-layer silicon nitride film.

In the first method for fabricating a semiconductor memory device, the etching performed with respect to the second and first insulating films in the step of exposing the edge portion of the upper surface of the gate electrode of each of the plurality of memory transistors is preferably isotropic etching. The arrangement allows easy exposure of only the edge portion of the gate electrode of each of the memory transistors.

In the first method for fabricating a semiconductor memory device, the etching performed with respect to the second and first insulating films after exposing the edge portion of the upper surface of the gate electrode of each of the plurality of memory transistors is preferably anisotropic etching. The arrangement allows easier formation of the inter-gate insulating film composed at least of the first insulating film between the respective gate electrodes of the memory transistors.

In the first method for fabricating a semiconductor memory device, the etching of the second and first insulating films is preferably performed under such a condition that an etch rate for each of the first and second insulating films is higher than an etch rate for the silicon-containing film. The arrangement can prevent the edge portion of the gate electrode of each of the memory transistors from being over-etched.

In the first method for fabricating a semiconductor memory device, the second insulating film is preferably formed by reverse sputtering. The arrangement allows the portion of the second insulating film overlying the gate electrode of each of the memory transistors to be formed into an upwardly protruding configuration and thereby allows easy exposure of only the edge portion of the gate electrode of each of the memory transistors.

A second method for fabricating a semiconductor memory device is a method for fabricating a semiconductor memory device having a memory region in which a plurality of memory cells each including a memory transistor are arranged as a matrix using a plurality of bit lines and a plurality of word lines intersecting each other and a logic region in which a logic transistor is disposed, the method comprising the steps of: forming, in the memory region, a first common impurity diffusion layer serving as a source region or drain region of each of the memory transistors composing those of the plurality of memory cells which are arranged in a direction in which each of the bit lines extends such that the first common impurity diffusion layer extends in the direction in which the bit line extends; forming a memory gate insulating film on the memory region of the substrate, while forming a logic gate insulating film on the logic region of the substrate; depositing a silicon-containing film on each of the memory gate insulating film and the logic gate insulating film; patterning the silicon-containing film in the memory region to form the common gate electrode of those of the plurality of memory transistors which are arranged in a direction in which each of the word lines extends such that the common gate electrode extends in the direction in which the word line extends; forming an insulating film on each of the memory region and the logic region; performing etching with respect to the insulating film on the memory region to expose an edge portion of an upper surface of the gate electrode of each of the plurality of memory transistors; after exposing the edge portion of the upper surface of the gate electrode, further performing etching to expose the upper surface of the gate electrode of each of the plurality of memory transistors and remove the edge portion of the upper surface of the gate electrode, while forming an inter-gate insulating film composed of the insulating film between the respective gate electrodes of those of the memory transistors which are adjacent to each other in the direction in which each of the bit lines extends; patterning the silicon-containing film in the logic region to form the gate electrode of the logic transistor; forming a sidewall insulating film on each side surface of the gate electrode of the logic transistor; forming, in the logic region, a second impurity diffusion layer serving as a source region or drain region of the logic transistor; and forming a silicide layer on each of the upper surface of the gate electrode of each of the plurality of memory transistors from which the edge portion has been removed, the upper surface of the gate electrode of the logic transistor, and an exposed portion of the second impurity diffusion layer.

Since the second method for fabricating a semiconductor memory device removes the edge portion of the upper surface of the gate electrode of each of the memory transistors, the upper surface of the gate electrode of the memory transistor can be formed into a protruding portion which is higher in level at the middle portion than at the edge portion. Accordingly, the silicide layer having a large contact area can be formed on the upper surface of the gate electrode of each of the memory transistors in the subsequent silicidization step. As a result, the resistance value per unit length of each of the gate electrode (bar resistance) of each of the memory transistors is reduced and the memory transistor can satisfy the requirements for further miniaturization and higher-speed operation.

In the second method for fabricating a semiconductor memory device, the memory gate insulating film preferably has a charge accumulation film.

In this case, the memory gate insulating film is preferably composed of a multilayer structure having a lower-layer silicon oxide film and an upper-layer silicon nitride film and the charge accumulation film is preferably composed of the upper-layer silicon nitride film.

Alternatively, in this case, the memory gate insulating film is preferably composed of a multilayer structure having a lower-layer silicon oxide film, an intermediate-layer silicon nitride film, and an upper-layer silicon oxide film and the charge accumulation film is preferably composed of the intermediate-layer silicon nitride film.

In the second method for fabricating a semiconductor memory device, the etching performed with respect to the insulating film in the step of exposing the edge portion of the upper surface of the gate electrode of each of the plurality of memory transistors is preferably isotropic etching.

In the second method for fabricating a semiconductor memory device, the etching performed with respect to the insulating film after exposing the edge portion of the upper surface of the gate electrode of each of the plurality of memory transistors is preferably anisotropic etching.

In the second method for fabricating a semiconductor memory device, the etching of the insulating film is preferably performed under such a condition that an etch rate for the insulating film is higher than an etch rate for the silicon-containing film.

In the second method for fabricating a semiconductor memory device, the insulating film is preferably formed by reverse sputtering.

BRIEF DESCRIPTION OF THE DRAWINGS

FIG. 1 is a partial plan view showing a semiconductor memory device according to a first embodiment of the present invention;

FIGS. 2A to 2C show the semiconductor memory device according to the first embodiment, of which FIG. 2A is a cross-sectional view taken along the line IIa-IIa of FIG. 1, FIG. 2B is a cross-sectional view taken along the line IIb-IIb of FIG. 1, and FIG. 2C is a cross sectional view taken along the line IIc-IIc of FIG. 1;

DESCRIPTION OF THE PREFERRED EMBODIMENTS

Embodiment 1

A first embodiment of the present invention will be described with reference to the drawings.

Figure 2A:
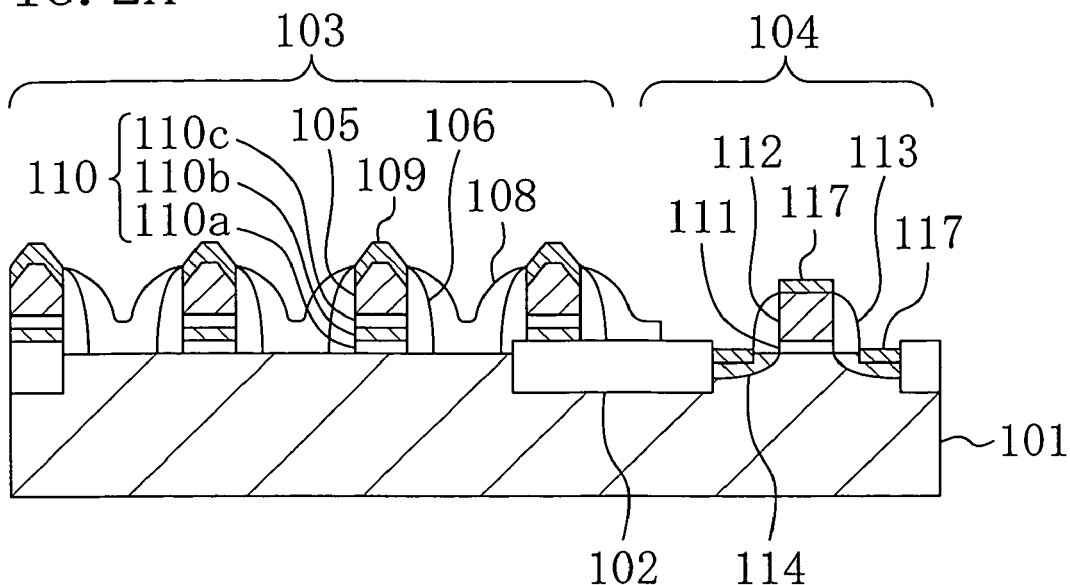
Figure 2B:
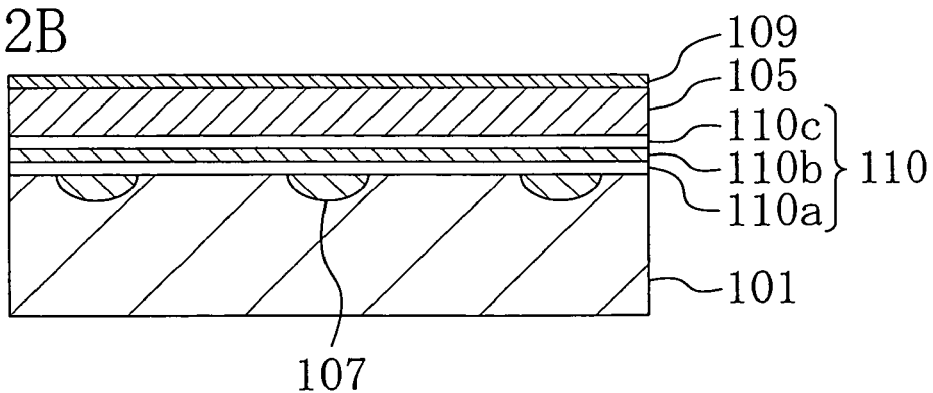
Figure 2C:
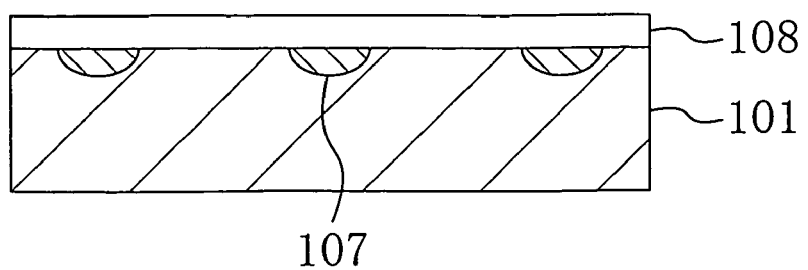

FIG. 1 shows a partial plan configuration of a semiconductor memory device according to the first embodiment. FIG. 2A shows a cross-sectional configuration along the line IIa-IIa of FIG. 1. FIG. 2B shows a cross-sectional configuration along the line IIb-IIb of FIG. 1. FIG. 2C shows a cross-sectional configuration along the line IIc-IIc of FIG. 1.

As shown in FIG. 1 and FIGS. 2A to 2C, the semiconductor memory device according to the first embodiment has a first active region 103 as a memory region in which a plurality of memory cells are provided and a second active region 104 as a logic region in which a logic element is provided. The first and second active regions 103 and 104 are isolated from each other by an isolation insulating film 102 formed selectively in an upper portion of a semiconductor substrate 101 made of, e.g., silicon (Si). In the first active region 103, a plurality of memory transistors are provided as a matrix, while a logic transistor is provided in the second active region 104.

In the first active region 103, a plurality of memory gate electrodes 105 are formed over the principal surface of the semiconductor substrate 101 with respective memory gate insulating films 110 interposed therebetween. Each of the memory gate insulating films 110 is composed of a multilayer structure having a lower gate insulating film 110a made of silicon oxide, a charge accumulation film 110b made of silicon nitride, and an upper gate insulating film 110c made of silicon oxide, which are formed successively on the principal surface of the semiconductor substrate 101. On the respective side surfaces of the memory gate insulating films 110 and the memory gate electrodes 105, sidewall insulating films 106 are formed.

A plurality of memory transistors arranged in the gate length directions (the directions in which the gate electrodes 105 extend) have the respective memory gate electrodes 105 which are formed in mutually connected relation to constitute common gate electrodes 105. The common memory gate electrodes 105 form individual word lines. The upper surface of each of the memory gate electrodes 105 has edge portions (peripheral portions) each processed into a tapered or rounded cross-sectional configuration. Silicide layers 109 are formed on the respective processed upper surfaces.

Since the gate electrode 105 of each of the memory transistors in the semiconductor device according to the first embodiment has the upper portion thereof thus processed into the tapered or rounded cross-sectional configuration, the cross-sectional area of each of the silicide layers 109 in the gate width direction (the direction perpendicular to the direction in which each of the gate electrodes 105 extends) is larger than the cross-sectional area in the gate width direction of the memory gate electrode according to the conventional embodiment and than the cross-sectional area in the gate width direction of a silicide layer 117 on the upper portion of a logic gate electrode 112 having the same width as each of the memory gate electrodes 105.

For example, when the upper surface of each of the memory gate electrodes 105 is formed to have edge portions each tapered at angle of 45° relative to a normal to a substrate surface and the resulting side-tapered upper surfaces of the memory gate 105 become tangent to each other at the middle to form an edge line, i.e., when a cross section of the upper portion of the memory gate electrode 105 in a direction perpendicular to the substrate surface has an isosceles-triangular configuration, the area of the upper surface of the memory gate electrode 105 including the edge portions thereof prior to a silicidization step is about 1.4 times the area thereof when no tapered configuration is formed. Consequently, the resistance value of the memory gate electrode 105 after the silicidization becomes about 0.7 times the resistance value thereof when no tapered configuration is formed. By thus making the taper angle more acute and increasing the size of the tapered portion, the resistance value of the memory gate electrode 105 can be reduced more effectively.

The cross section of the upper portion of the memory gate electrode 105 in the direction perpendicular to the substrate surface is not limited to a tapered configuration or a rounded configuration provided that the upper surface of the memory gate electrode 105 has a protruding configuration which is higher in level at the middle portion than at the edge portions.

In the first active region 103 as the memory region, impurity diffusion layers 107 are formed to extend in directions orthogonal to the directions in which the word lines extend. Each of the impurity diffusion layers 107 is formed to serve as the common source region or drain region of the memory transistors which are arranged in the direction orthogonal to the direction in which each of the word lines extends, while connecting the memory transistors to each other. These common source region or drain regions form bit lines.

Thus, each of the memory transistors is constituted by the memory gate insulating film 110, the memory gate electrode 105 having the silicide layer 109 formed on the upper portion thereof, and the impurity diffusion layers 107. Between the memory gate electrodes 105, memory inter-gate insulating films 108 are formed.

In the second active region 104 as the logic region, on the other hand, the logic gate electrode 112 is formed over the principal surface of the semiconductor substrate 101 with a logic gate insulating film 111 made of silicon oxide interposed therebetween. A sidewall insulating film 113 is formed on each of the respective side surfaces of the logic gate insulating film 111 and the logic gate electrode 112. In the second active region 104, the impurity diffusion layers 114 each serving as the source region or drain region are formed. The silicide layers 117 are formed on the respective upper surfaces of the logic gate electrode 112 and the impurity diffusion layers 114.

Thus, the logic transistor composed of a field-effect transistor is constituted by the logic gate insulating film 111, the logic gate electrode 112 having the silicide layer 117 formed on the upper portion thereof, and the impurity diffusion layers 114 each having the silicide layer 117 formed on the upper portion thereof.

A method for fabricating the semiconductor memory device according to the first embodiment thus constituted will be described herein below with reference to the cross-sectional views of FIGS. 3A to 3C through FIGS. 10A to 10C which illustrate individual process steps in the order in which the fabrication process proceeds. Each of FIGS. 3A, 4A, 5A, 6A, 7A, 8A, 9A, and 10A shows a cross-sectional configuration of the portion corresponding to the line IIa-IIa of FIG. 1.

Each of FIGS. 3B, 4B, 5B, 6B, 7B, 8B, 9B, and 10B shows a cross-sectional configuration of the portion corresponding to the line IIb-IIb of FIG. 1. Each of FIGS. 3C, 4C, 5C, 6C, 7C, 8C, 9C, and 10C shows a cross-sectional configuration of the portion corresponding to the line IIc-IIc of FIG. 1.

Figure 3A:
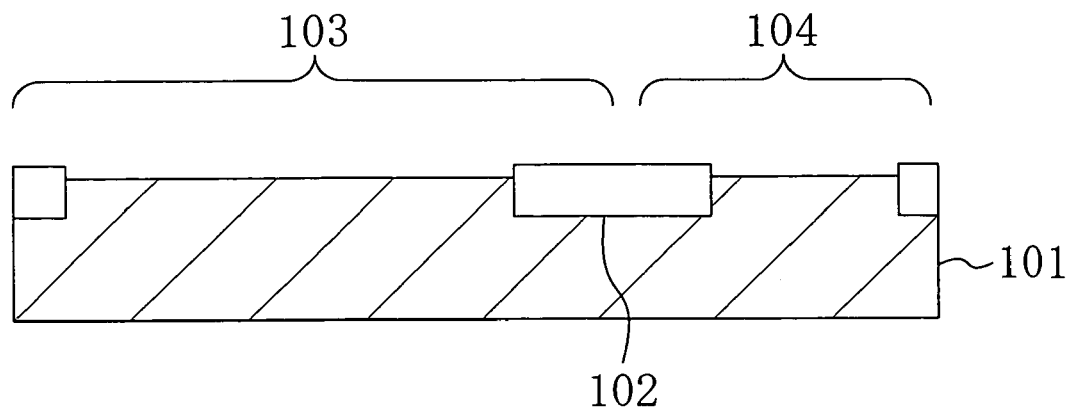
FIGS. 3A to 3C are cross-sectional views illustrating a process step of a method for fabricating the semiconductor memory device according to the first embodiment.
Figure 3B:
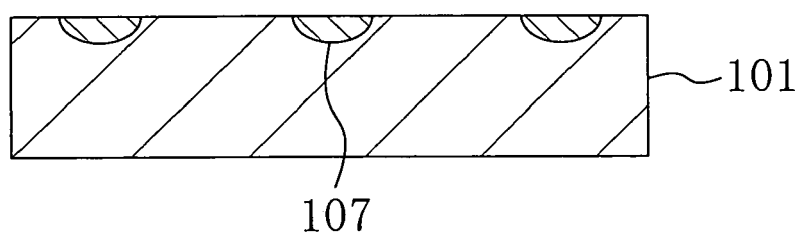
Figure 3C:
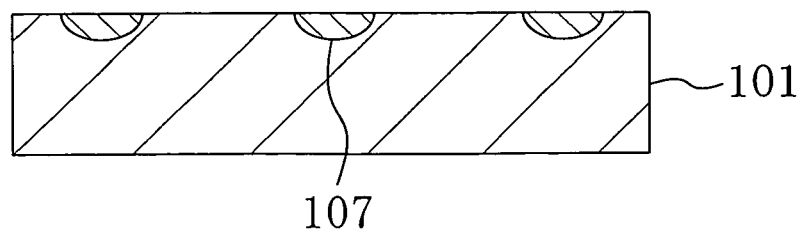

First, as shown in FIGS. 3A, 3B, and 3C, silicon oxide is buried in trenched portions each formed at a depth of about 300 nm in the upper portion of the semiconductor substrate 101 to form the isolation insulating film 102, whereby the first active region 103 as the memory region and the second active region 104 as the logic region are formed. Subsequently, impurity ions, e.g., arsenic ions are implanted at a dose of about $5 \times 10^{15}/cm^2$ into the specified portions of the first active region 103 with an acceleration voltage of about 50 KeV. Then, a thermal process in a nitrogen atmosphere at a temperature of, e.g., about 900° C. is performed for about 60 minutes with respect to the semiconductor substrate 100 into which the ions have been implanted to activate the implanted arsenic ions, whereby the plurality of impurity diffusion layers 107 serving as the source or drain regions of the memory transistors are formed in the directions in which the bit lines extend.

Figure 4A:
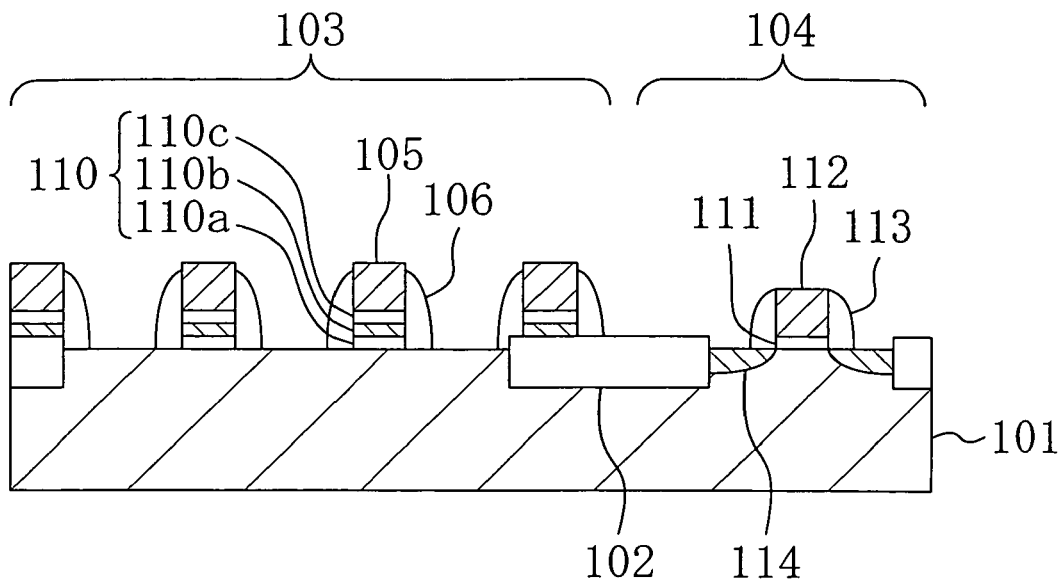
FIGS. 4A to 4C are cross-sectional views illustrating a process step of the method for fabricating the semiconductor memory device according to the first embodiment.
Figure 4B:
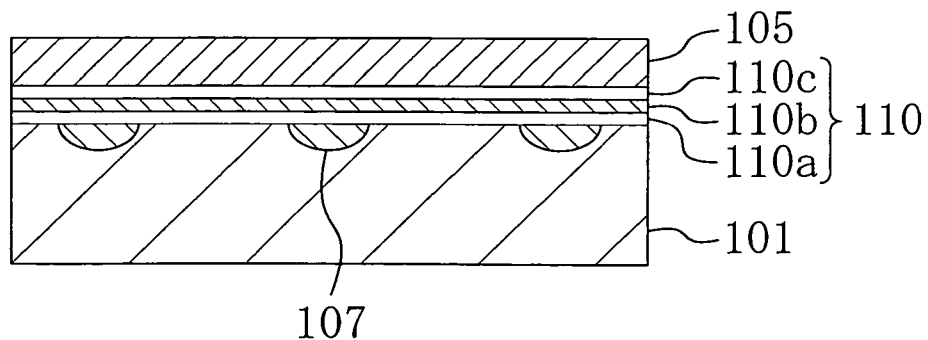
Figure 4C:
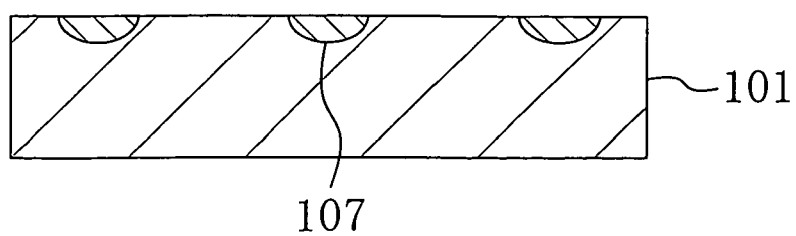

Next, as shown in FIGS. 4A, 4B, and 4C, a lower-layer silicon oxide film having a thickness of 10 nm is formed by thermal oxidation on each of the first and second active regions 103 and 104 of the principal surface of the semiconductor substrate 101 and an intermediate-layer silicon nitride film having a thickness of 7 nm and an upper-layer silicon oxide film having a thickness of 10 nm are deposited successively on the formed lower-layer silicon oxide film by low-pressure CVD (chemical vapor deposition). It is to be noted that the upper-layer silicon oxide film need not necessarily be formed.

Subsequently, the intermediate-layer silicon oxide film and the upper-layer silicon oxide film are removed selectively from the second active region 104 by using a well-known etching technology. Then, a polycrystalline silicon film as a silicon-containing film having a thickness of about 200 nm is deposited by low-pressure CVD on each of the first and second active regions 103 and 104. Subsequently, impurity ions, e.g., phosphorus ions are implanted at a dose of about $2 \times 10^{15}/cm^2$ into the deposited polycrystalline silicon films with an acceleration voltage of about 10 KeV. Thereafter, a thermal process in a nitrogen atmosphere at a temperature of, e.g., about 800° C. is performed for about 15 minutes with respect to the polycrystalline silicon films into which the ions have been implanted, thereby activating the implanted phosphorus ions.

Then, in the first active region 103, the polycrystalline silicon film, the upper-layer silicon oxide film, the intermediate-layer silicon nitride film, and the lower-layer silicon oxide film are patterned successively by using well-known lithographic and etching technologies to form the memory gate electrodes 105 each composed of the polycrystalline silicon film and the memory gate insulating films 110 each constituted by a multilayer structure having the upper gate insulating film 110c composed of the upper-layer silicon oxide film, the charge accumulation film 110b composed of the intermediate-layer silicon nitride film, and the lower silicon oxide film 110a composed of the lower-layer silicon oxide film.

In the second active region 104, on the other hand, the polycrystalline silicon film and the lower-layer silicon oxide film are patterned by using lithography and etching technologies to form the logic gate electrode 112 composed of the polycrystalline silicon film and the logic gate insulating film 111 composed of the lower-layer silicon oxide film.

Subsequently, in each of the first and second active regions 103 and 104, a silicon oxide film having a thickness of about 100 nm is deposited by low-pressure CVD and an etch-back process corresponding to a depth of about 110 nm is performed with respect to the deposited silicon oxide film, thereby forming the sidewall insulating films 106 on the respective side surfaces of the memory gate electrode 105 and the memory gate insulating film 110, while forming the sidewall insulating film 113 on the side surfaces of the logic gate electrode 112.

Subsequently, impurity ions, e.g., arsenic ions are implanted into the second active region 104 by using the logic gate electrode 112 and the sidewall insulating film 113 as a mask and then a specified thermal process is performed to form the impurity diffusion layers 114 each serving as the source region or drain region.

Figure 5A:
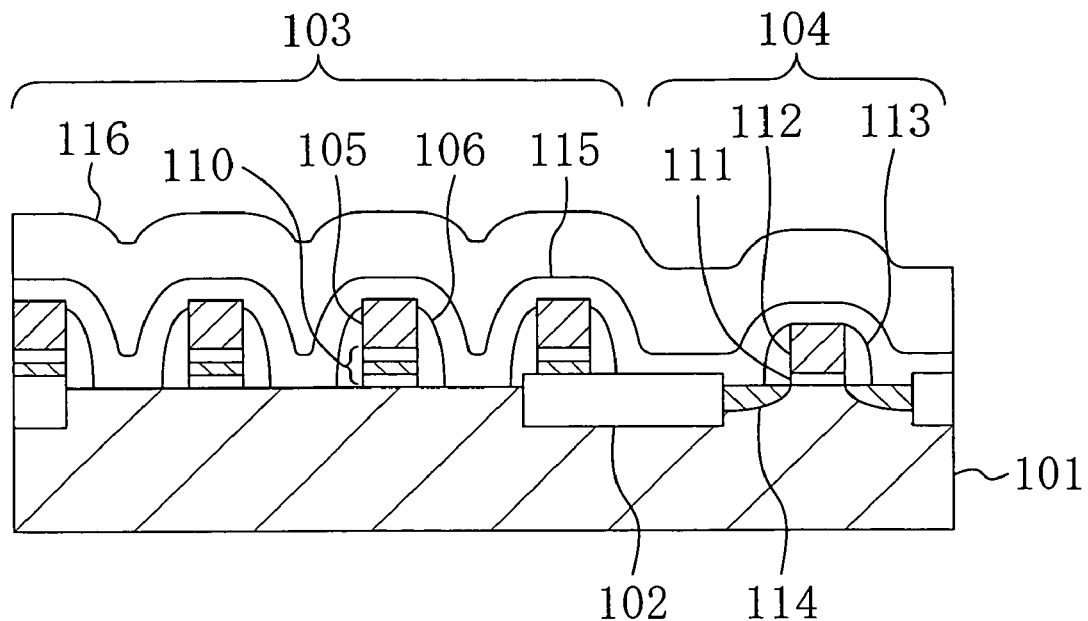
FIGS. 5A to 5C are cross-sectional views illustrating a process step of the method for fabricating the semiconductor memory device according to the first embodiment.
Figure 5B:
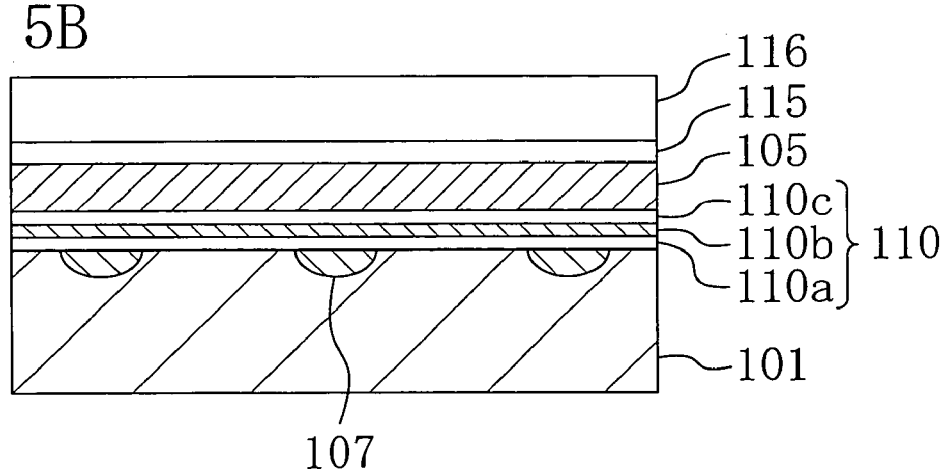
Figure 5C:
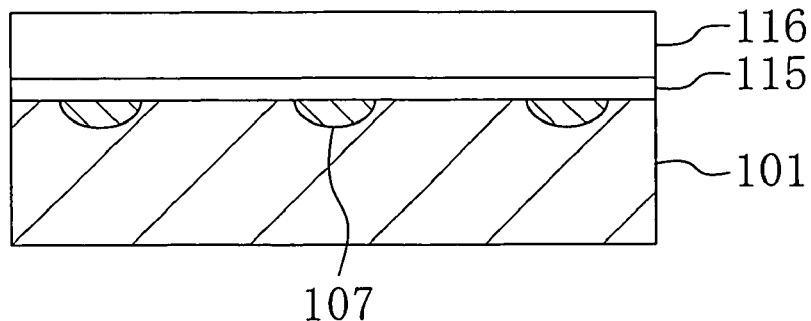

Next, as shown in FIGS. 5A, 5B, and 5C, the first insulating film 115 composed of a silicon oxide film having a thickness of about 30 nm is deposited by plasma CVD over the entire surface of the semiconductor substrate 101 including the plurality of memory gate electrodes 105, the logic gate electrode 112, and the isolation insulating film 102 in the first and second active regions 103 and 104. Subsequently, a second insulating film 116 composed of a BPSG (boron-doped phospho-silicate glass) film having a thickness of about 300 nm and containing a phosphorous impurity at a concentration of 2 wt % and a boron impurity at a concentration of 7 wt % is deposited by atmospheric-pressure CVD on the deposited first insulating film 115.

Figure 6A:
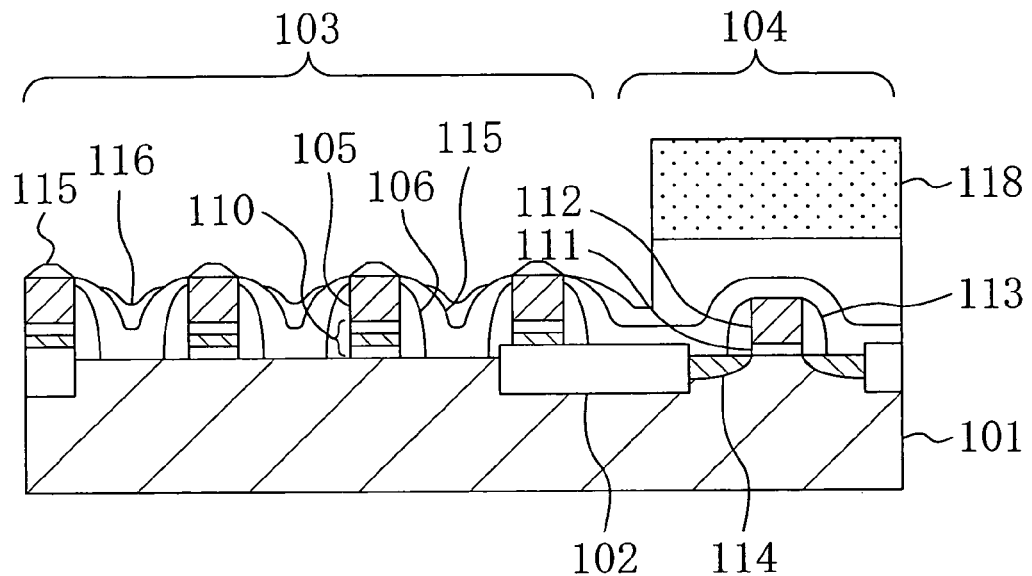
FIGS. 6A to 6C are cross-sectional views illustrating a process step of the method for fabricating the semiconductor memory device according to the first embodiment.
Figure 6B:
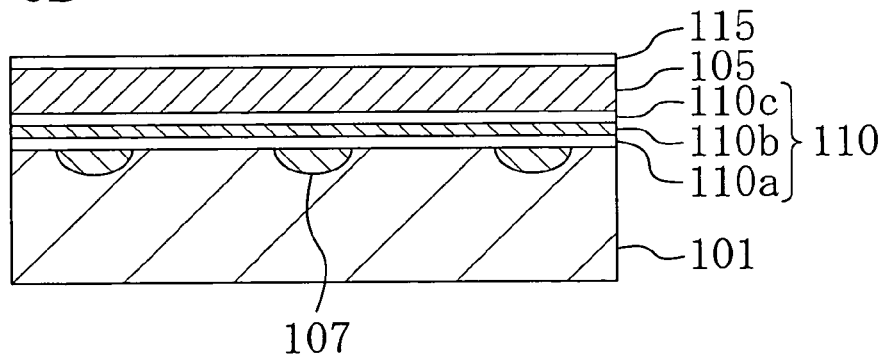
Figure 6C:
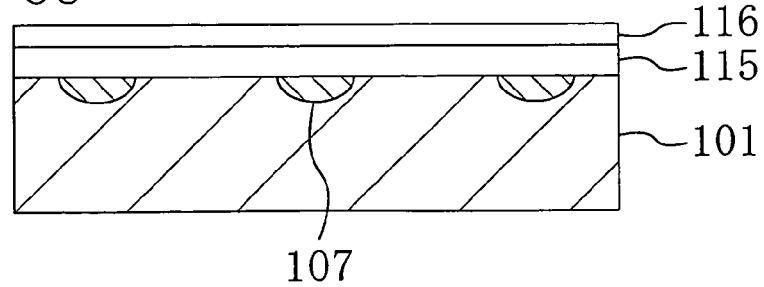

Next, as shown in FIGS. 6A, 6B, and 6C, a first resist pattern 118 for exposing the first active region 103 is formed by using a lithographic technology on the second insulating film 116 and then anisotropic etching including an isotropic etching component is performed with respect to the second and first insulating films 116 and 115 by using the formed first resist pattern 118 as a mask, thereby exposing the edge portions of the upper surface of each of the memory gate electrodes 105. By way of example, the dry etching including an isotropic etching component is performed under such conditions that tetra fluorocarbon ($CF_4$) at a flow rate of 100 $cm^3$/min (at 0° C. and 1 atm) and oxygen ($O_2$) at a flow rate of 20 $cm^3$/min (at 0° C. and 1 atm) are used as etching gases, power is adjusted to 100 W, and the pressure in a chamber is adjusted to 50 Pa.

Figure 7A:
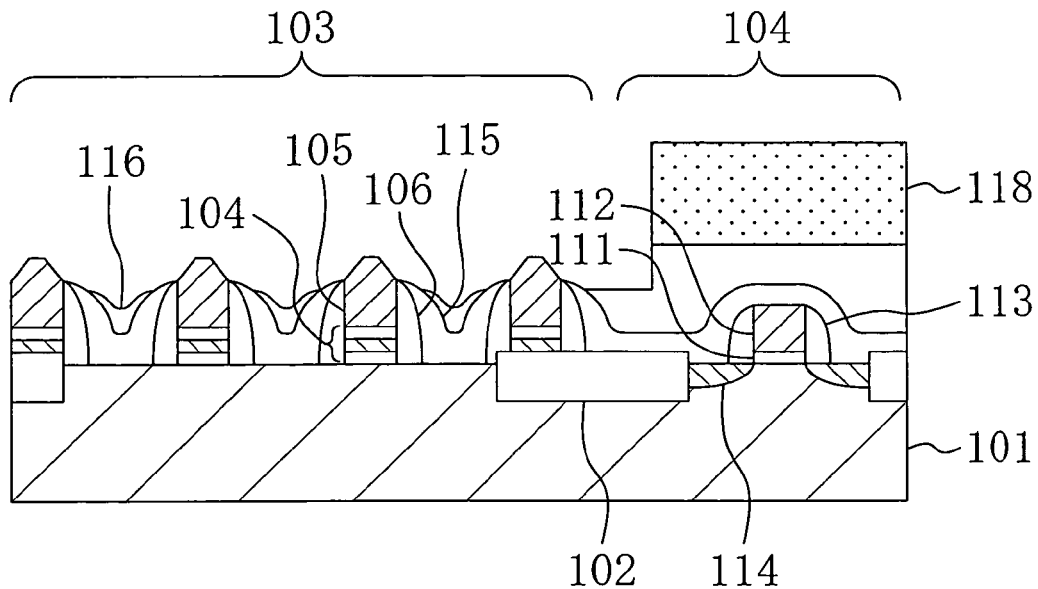
FIGS. 7A to 7C are cross-sectional views illustrating a process step of the method for fabricating the semiconductor memory device according to the first embodiment.
Figure 7B:
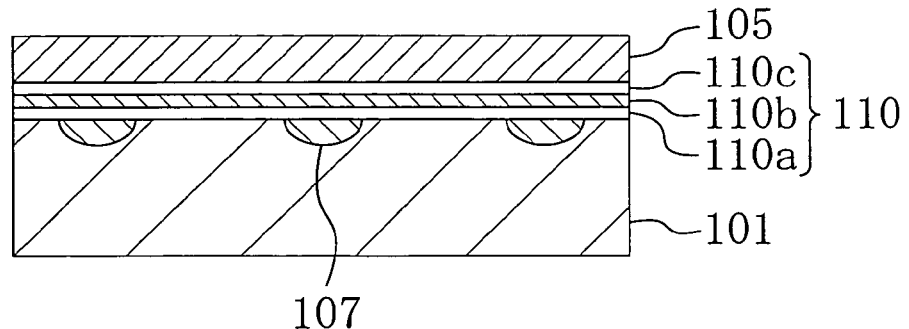
Figure 7C:
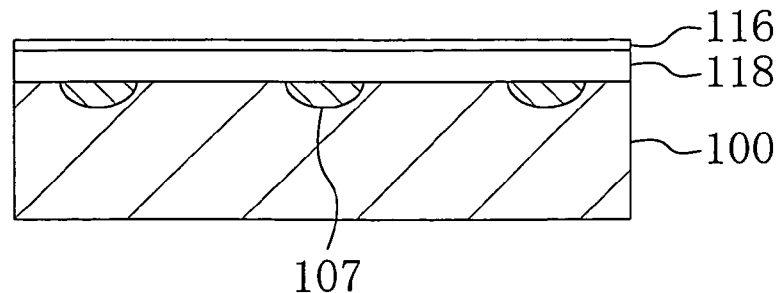

Next, as shown in FIGS. 7A, 7B, and 7C, an etching process is further performed under dry etching conditions including the lower etching selectivity between the polycrystalline silicon and the first and second insulating films 115 and 116 each containing silicon oxide as the main component, thereby exposing the upper surface of each of the memory gate electrodes 105, while etching each of the edge portions of the upper surfaces of the memory gate electrodes 105 into a tapered or rounded configuration by using an over-etching process. By way of example, the dry etching with the low etching selectivity may be performed appropriately by increasing the flow rate of oxygen among the foregoing etching conditions from 20 $cm^3$/min (at 0° C. and 1 atm) to 50 $cm^3$/min (at 0° C. and 1 atm).

It is to be noted that each of the edge portions of the upper surfaces of the memory gate electrodes 105 is not limited to a tapered or rounded configuration provided that etching is performed in such a manner as to form the upper surface of each of the memory gate electrodes 105 into a protruding portion which is higher in level at the middle portion than at the edge portions (peripheral portions). By the sequence of etching steps also, the first insulating film 115 is left as the memory inter-gate insulating films 108 on the regions of the principal surface of the semiconductor substrate 101 which are located between the plurality of memory gate electrodes 105.

Thus, the fabrication method according to the first embodiment performs anisotropic etching including an isotropic etching component, as shown in FIGS. 6A, 6B, and 6C, and thereby allows the edge portions of the upper surface of each of the memory gate electrodes 105 to be exposed before the middle portion thereof is exposed. As a result, the edge portions of the upper surface of the memory gate electrode 105 are exposed to an etching gas for a longer period than the middle portion thereof, which allows the formation of each of the edge portions of the upper surfaces of the gate electrodes into a tapered or rounded configuration. Since at least the first insulating film 115 exists between the adjacent memory gate electrodes 105 in the sequence of etching steps, the regions of the semiconductor substrate 101 which are located between the memory gate electrodes 105 are prevented from being grated by etching. Moreover, since the second active region 104 is covered with the first resist pattern 118 in the sequence of etching steps, the portion of the semiconductor substrate 101 included in the second active region 104, the isolation insulating film 102, and the logic gate electrode 112 are prevented from being grated by etching.

Figure 8A:
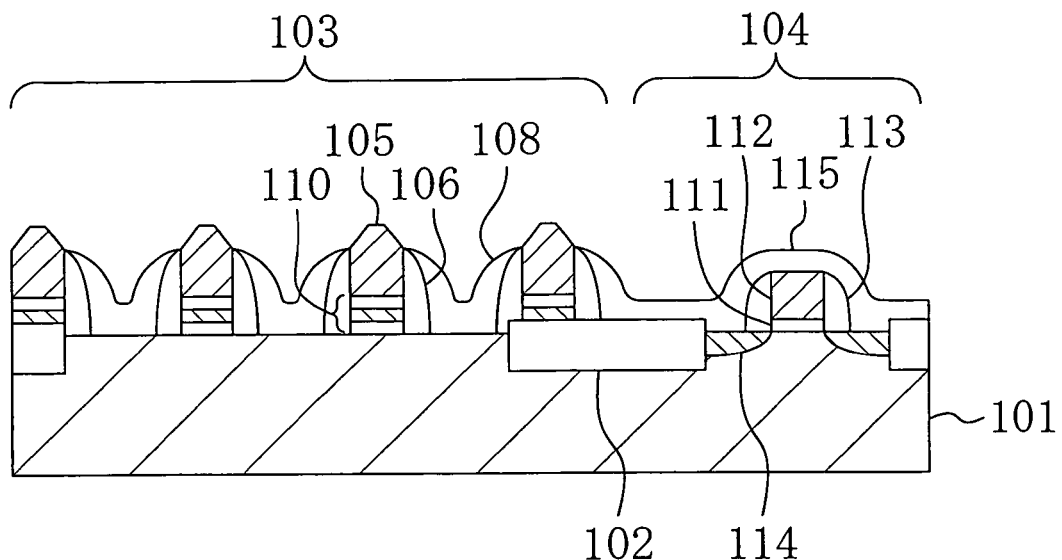
FIGS. 8A to 8C are cross-sectional views illustrating a process step of the method for fabricating the semiconductor memory device according to the first embodiment.
Figure 8B:
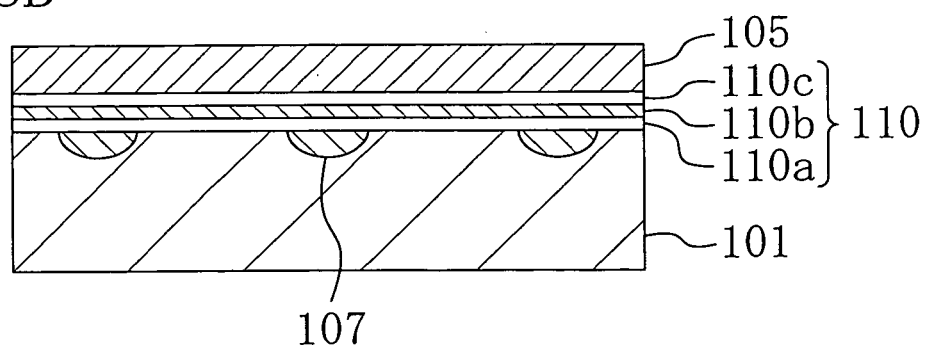
Figure 8C:
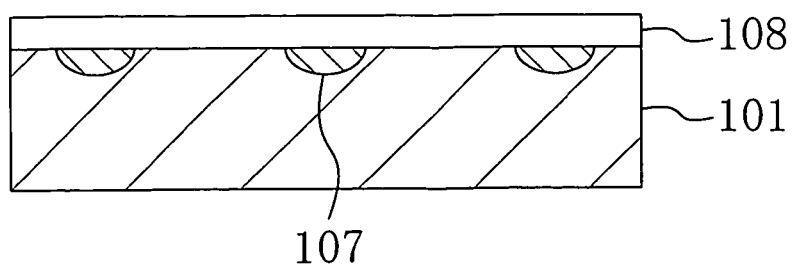

Next, as shown in FIGS. 8A, 8B, and 8C, the first resist pattern 118 is removed and then the second insulating film 116 is removed by wet etching using a diluted hydrofluoric acid solution. As a result, the second insulating film 116 remaining between the memory gate electrodes 105 is substantially removed from the first active region 103 so that the memory inter-gate insulating film 108 composed of the first insulating film 115 is formed. The second insulating film 116 is also substantially removed from the second active region 104 so that the first insulating film remains.

Figure 9A:
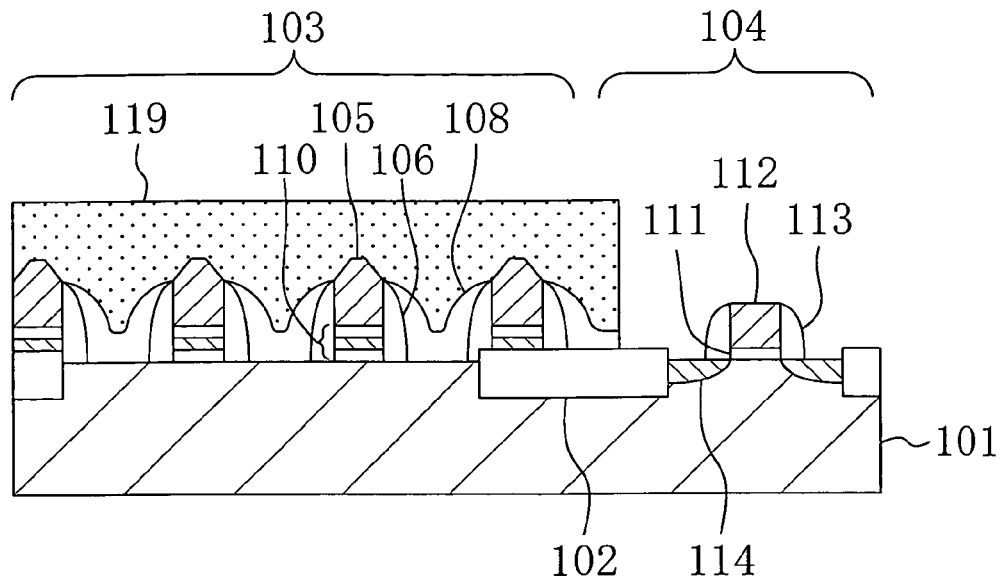
FIGS. 9A to 9C are cross-sectional views illustrating a process step of the method for fabricating the semiconductor memory device according to the first embodiment.
Figure 9B:
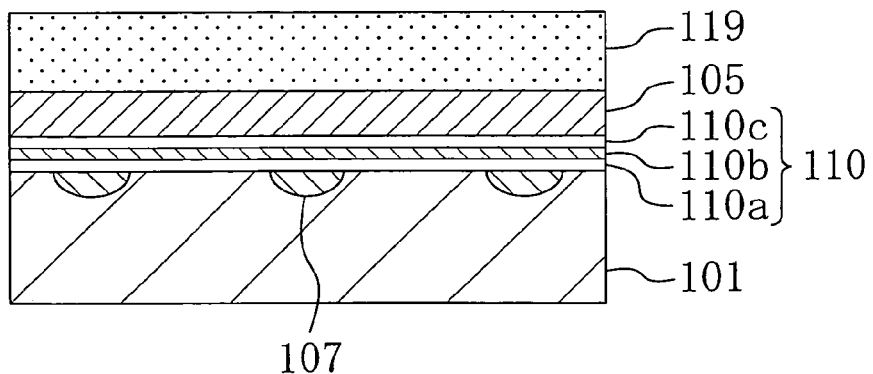
Figure 9C:
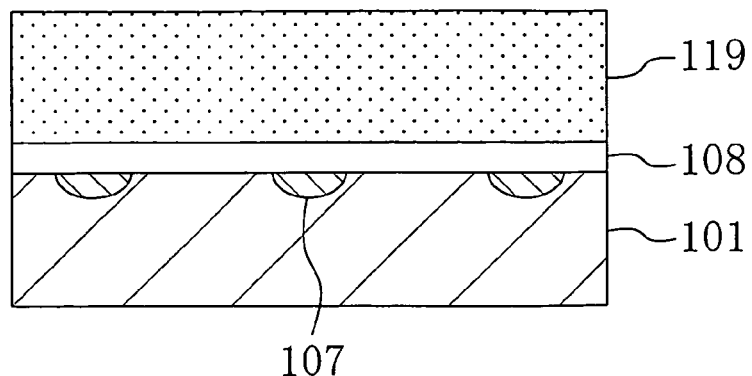

Next, as shown in FIGS. 9A, 9B, and 9C, a second resist pattern 119 for exposing the second active region 104 is formed by using a lithographic technology on the semiconductor substrate 101. Then, wet etching using a diluted hydrofluoric acid solution is performed with respect to the first insulating film 115 by using the formed second resist pattern 119 as a mask to remove the first insulating film 115 remaining in the second active region 104, thereby exposing the respective upper surfaces of the logic gate electrode 112 and the impurity diffusion layer 114.

Figure 10A:
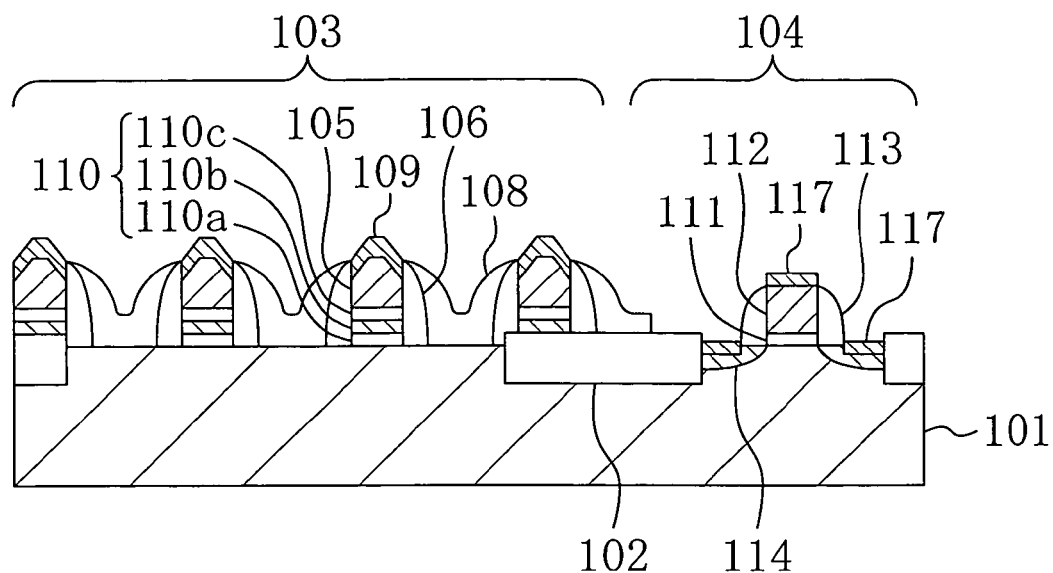
FIGS. 10A to 10C are cross-sectional views illustrating a process step of the method for fabricating the semiconductor memory device according to the first embodiment.
Figure 10B:
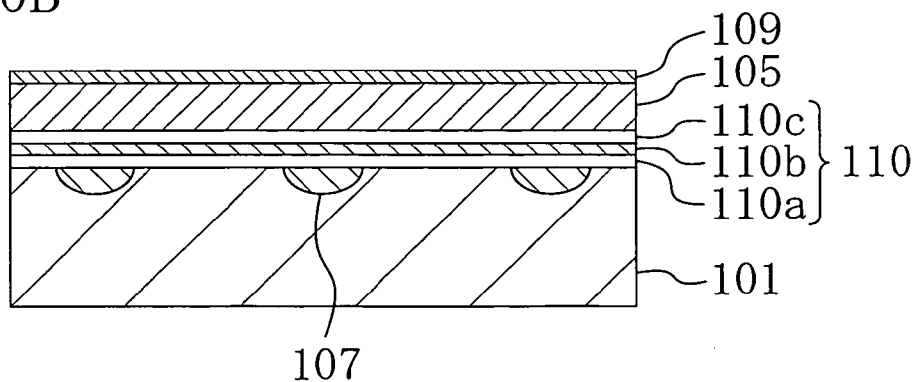
Figure 10C:
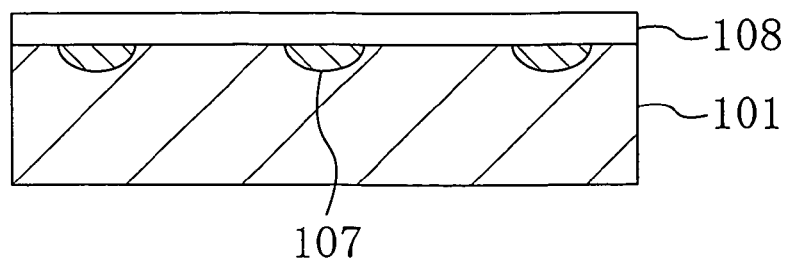

Next, as shown in FIGS. 10A, 10B, and 10C, the silicide layer 109 is formed by using a salicide technology on the tapered or rounded upper surface as the protruding portion of each of the memory gate electrodes 105 including the edge portions in the first active region 103. At the same time, the silicide layer 117 is formed on each of the upper surface of the logic gate electrode 112 and the upper surface of the impurity diffusion layer 114 in the second active region 104.

By the process described above, the semiconductor memory device according to the first embodiment can be obtained. Since a metal wiring step, a protection-film forming step, a bonding-pad forming step, and the like which are performed subsequently are well known, the description thereof will be omitted.

As described above, the first embodiment allows easy formation of the silicide layer 109 on each of the memory gate electrodes 105 such that the length of the silicide layer 109 in the gate width direction is larger than the width of the gate by forming the upper surface of each of the memory gate electrodes 105 into the protruding portion having the upwardly protruding middle portion in the first active region 103 as the memory region and then forming the silicide layer 109 on the protruding portion. As a result, the contact area of the silicide layer 109 per unit length of the gate electrode increases and the resistance value per unit length of the memory gate electrode 105 (bar resistance) can be reduced. This allows the memory transistor to satisfy the requirements for further miniaturization and higher-speed operation.

Variation 1 of Embodiment 1

Figure 11A:
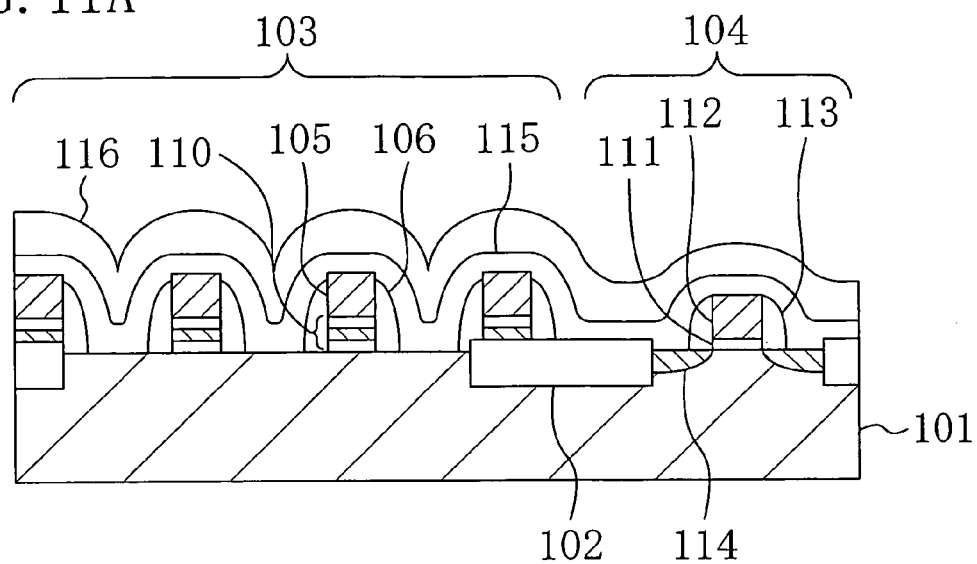
FIGS. 11A to 11C are cross-sectional views illustrating a process step of a method for fabricating a semiconductor memory device according to a first variation of the first embodiment.
Figure 11B:
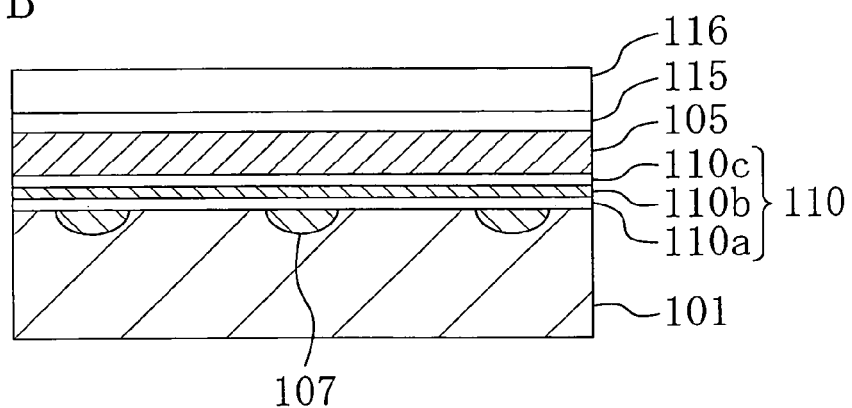
Figure 11C:
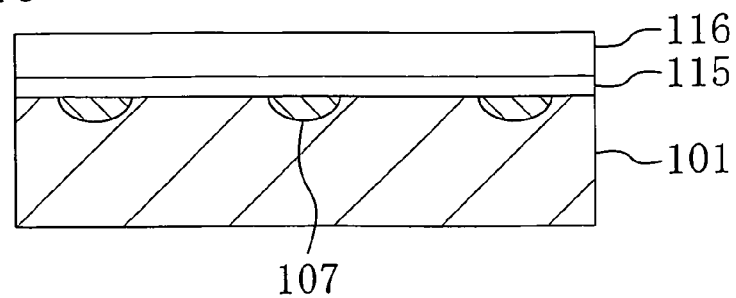

Referring to FIGS. 11A to 11C, a description will be given herein below to a method for fabricating a semiconductor memory device according to a first variation of the first embodiment of the present invention.

In contrast to the fabrication method according to the first embodiment which has used the anisotropic dry etching process including an isotropic etching component as the etching process for selectively exposing the edge portions of the upper surface of each of the memory gate electrodes 105 shown in FIGS. 6A to 6C, the first variation performs isotropic etching and thereby forms the second insulating film 116 such that it is thinner at the portions thereof in the vicinity of the edge portions of the upper surface of the memory gate electrode 105 than at the middle portion thereof.

Specifically, as shown in FIGS. 11A, 11B, and 11C, wet etching using, e.g., a diluted hydrofluoric acid solution is performed with respect to the second insulating film 116 composed of the BPSG film to form the second insulating film 116 such that the portion of the second insulating film 116 overlying each of the memory gate electrodes 105 is thinner over each of the edge portions (peripheral portions) of the memory gate electrode 105 than over the middle portion thereof.

Thereafter, anisotropic dry etching is performed to form the upper portion of each of the memory gate electrodes 105 into a tapered or rounded protruding configuration, as shown in FIGS. 7A, 7B, and 7C.

Variation 2 of Embodiment 1

Figure 12A:
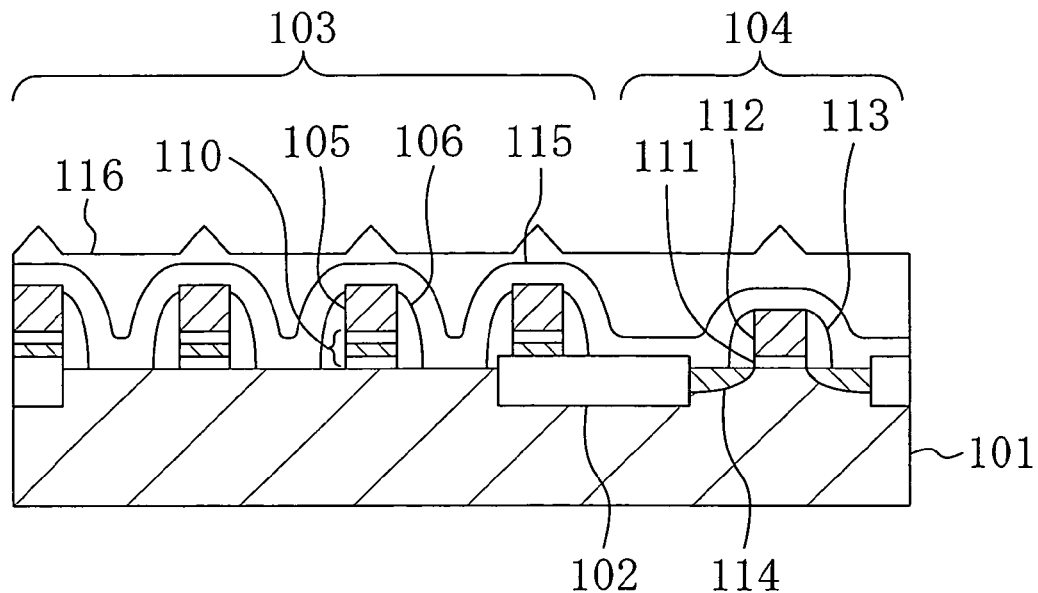
FIGS. 12A to 12C are cross-sectional views illustrating a process step of a method for fabricating a semiconductor memory device according to a second variation of the first embodiment.
Figure 12B:
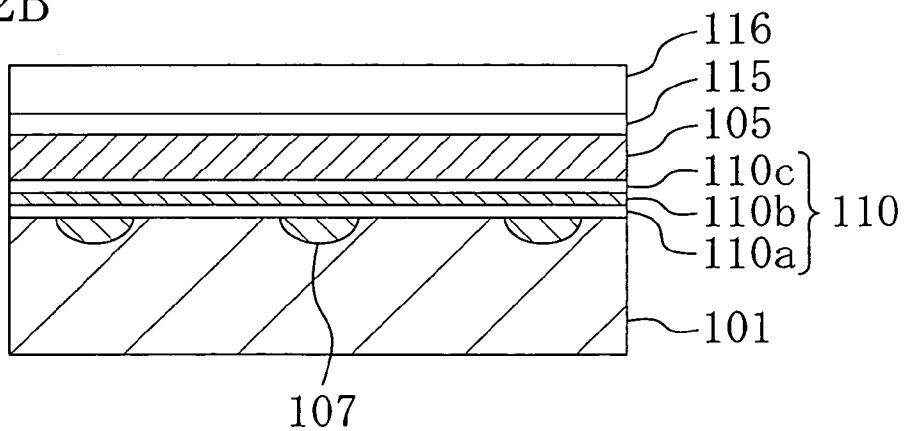
Figure 12C:
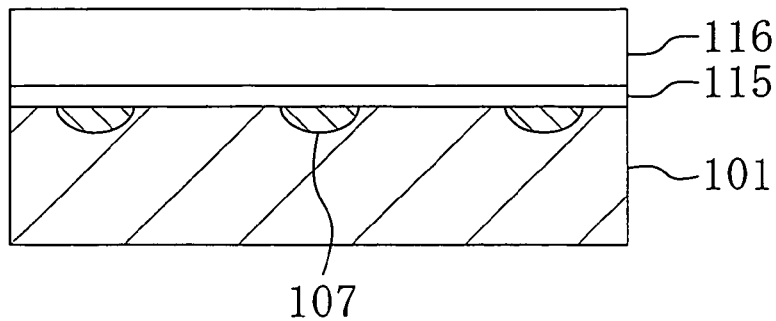

Referring to FIGS. 12A to 12C, a description will be given herein below to a method for fabricating a semiconductor memory device according to a second variation of the first embodiment of the present invention.

In contrast to the fabrication method according to the first embodiment which has used the atmospheric-pressure CVD as the deposition method for the second insulating film 116 shown in FIGS. 5A to 5C, the fabrication method according to the second variation uses a reverse sputtering process such as argon sputtering.

Specifically, as shown in FIGS. 12A, 12B, and 12C, when the second insulating film 116 composed of the BPSG film is deposited by using a sputtering technology which covers the surface (target surface) of a target material made of silicon oxide containing a phosphorus impurity and a boron impurity for a proper period of time to perform so-called reverse sputtering, the second insulating film 116 having a configuration which is thinner over the edge portions of the upper surface of each of the memory gate electrodes 105 than over the middle portion thereof can be formed.

As a result, the edge portions of the upper surface of each of the memory gate electrodes 105 can be exposed more easily in the subsequent etching step shown in FIGS. 6A to 6C. This allows the upper surface of each of the memory gate electrodes 105 to be exposed and each of the edge portions thereof to be etched easily into a tapered or rounded configuration as shown in FIGS. 7A to 7C.

In the first embodiment, the memory gate electrodes 105 in the first active region 103 and the logic gate electrode 112 in the second active region 104 are formed simultaneously in the same patterning step. This obviates the necessity to provide an extra margin between each of the memory gate electrodes 105 and the logic gate electrode 112 and an upper-layer contact formed thereon and thereby allows miniaturization.

Although the first embodiment has described the case where each of the memory elements formed in the first active region 103 is of the type which traps charge in the memory gate insulating film 110, it may also be of a type which has a floating gate electrode provided between the gate insulating film 110 and the gate electrode 105 and traps charge in the provided floated gate electrode.

Although the first embodiment has deposited, in the insulating-film forming step shown in FIGS. 5A and 5C, two types of insulating films having different compositions such as the first insulating film 115 made of silicon oxide and the second insulating film 116 made of BPSG and thereby formed the memory inter-gate insulating films 108 between those of the gate electrodes 105 which are adjacent in the directions in which the bit lines (the impurity diffusion layers 107) extend, they are not limited thereto. It is also possible to stack three or more types of insulating films in layers. The reason for using two or more types of insulating films to form the memory inter-gate insulating films 108 is that the memory gate electrodes 105 and the logic gate electrode 112 are patterned in the same step in the first embodiment, as described above. Accordingly, if the memory inter-gate insulating films 108 which are necessary between the individual memory gate electrodes 105 formed in the first active region 103 as the memory region are deposited on the semiconductor substrate 101, the insulating film for forming the memory inter-gate insulating films 108 is deposited also on each of the logic gate electrode 112 and the impurity diffusion layers 114 in the second active region 104 as the logic region.

However, the insulating film for forming the memory inter-gate insulating films that has been deposited on each of the logic gate electrode 112 and the impurity diffusion layer 114 in the second active region 104 should be removed when the silicide layer 117 is formed on each of the upper surfaces of the logic gate electrode 112 and the impurity diffusion layers 114. Accordingly, the insulating film for forming the memory inter-gate insulating film can be removed preferably from the second active region 104, while it is filled reliably in the first active region 103 even when the spacings between the gate electrodes 105 are narrow. Such ease of filling and ease of removal can be achieved more easily with a plurality of insulating films having different compositions than with an insulating film having a single composition. By way of example, therefore, the first embodiment has used silicon oxide for the first insulating film 115 and BPSG for the second insulating film 116 and thereby allowed easy removal of the second insulating film 116 by wet etching, as shown in FIGS. 8A, 8B, and 8C.

Although the first embodiment has described the case where the memory gate electrodes 105 and the logic gate electrode 112 are formed in the same step, the memory gate electrodes 105 and the logic gate electrode 112 may also be formed in different steps if a sufficient margin can be provided between each of the memory gate electrodes 105 and the logic gate electrode 112 and the upper-layer contact. This example will be described as a second embodiment of the present invention.

Embodiment 2

The second embodiment of the present invention will be described with reference to the drawings.

Figure 13:
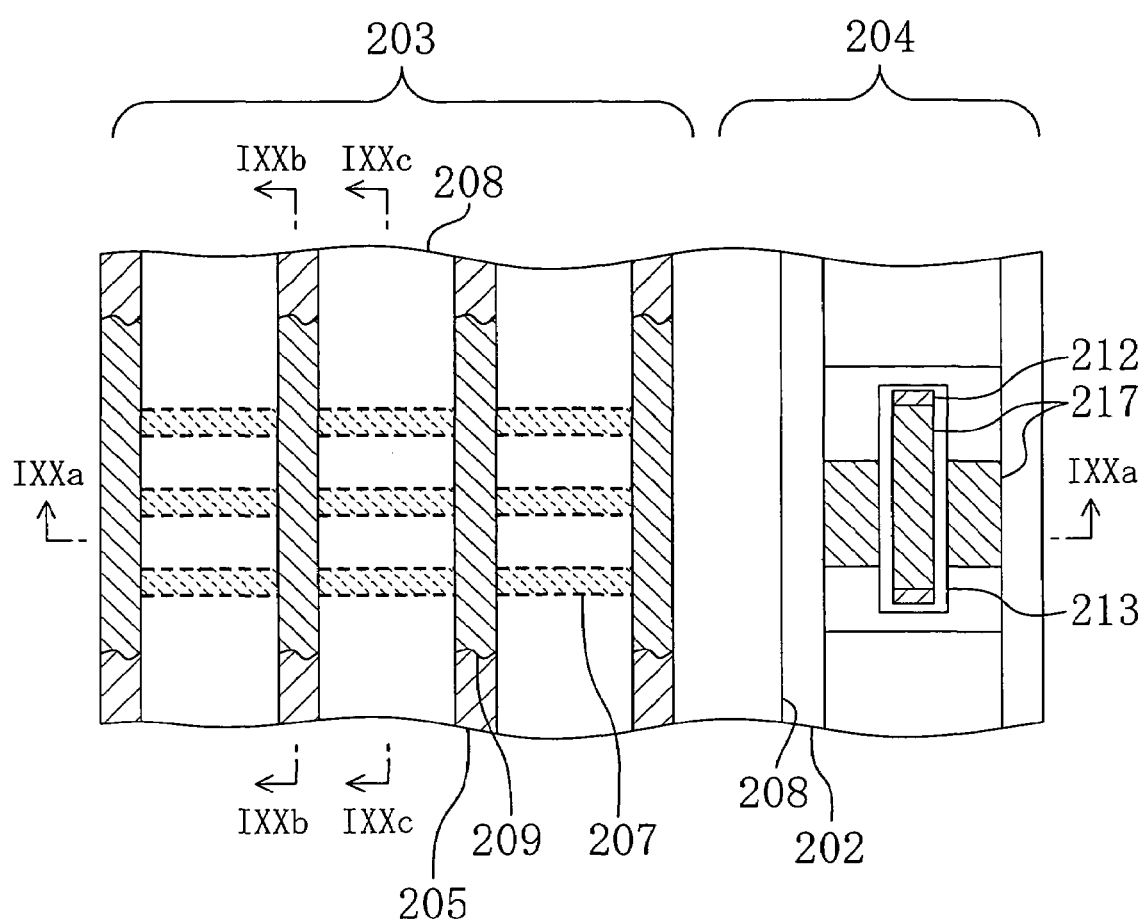
FIG. 13 is a partial plan view showing a semiconductor memory device according to a second embodiment of the present invention.

FIG. 13 shows a partial plan configuration of a semiconductor memory device according to the second embodiment.

As shown in FIG. 13, the semiconductor memory device according to the first embodiment has a first active region 203 as a memory region in which a plurality of memory cells are provided and a second active region 204 as a logic region in which a logic element is provided. The first and second active regions 203 and 204 are isolated from each other by an element isolation insulating film formed selectively in an upper portion of a semiconductor substrate made of, e.g., silicon (Si). In the first active region 203, a plurality of memory transistors are provided as a matrix, while a logic transistor is provided in the second active region 204.

In the first active region 203, a plurality of memory gate electrodes 205 are formed on the principal surface of the semiconductor substrate with respective memory gate insulating films interposed therebetween. Each of the memory gate insulating films is composed of a multilayer structure having a lower gate insulating film made of silicon oxide, a charge accumulation film made of silicon nitride, and an upper gate insulating film made of silicon oxide, which are formed successively on the principal surface of the semiconductor substrate.

A plurality of memory transistors arranged in the gate length direction (the direction in which each of the gate electrodes 205 extends) have the respective memory gate electrodes 205 which are formed in mutually connected relation to constitute common gate electrodes 205. The common memory gate electrodes 205 form individual word lines. The upper surface of each of the memory gate electrodes 205 has edge portions (peripheral portions) each processed into a tapered or rounded cross-sectional configuration. Silicide layers 209 are formed on the respective processed upper surfaces.

The cross section of the upper portion of the memory gate electrode 205 in the direction perpendicular to the substrate surface is not limited to a tapered configuration or a rounded configuration provided that the upper surface of the memory gate electrode 205 has a protruding configuration which is higher in level at the middle portion than at the edge portions.

In the first active region 203 as the memory region, impurity diffusion layers 207 are formed to extend in directions orthogonal to the directions in which the word lines extend. Each of the impurity diffusion layers 207 is formed to serve as the common source or drain region of the memory transistors which are arranged in the direction orthogonal to the direction in which each of the word lines extends, while connecting the memory transistors to each other. These common source or drain regions form bit lines.

Thus, each of the memory transistors is constituted by the memory gate insulating film, the memory gate electrode 205 having the silicide layer 209 formed on the upper surface thereof, and the impurity diffusion layers 207. Between the memory gate electrodes 205, memory inter-gate insulating films 208 are formed.

In the second active region 204 as the logic region, on the other hand, the logic gate electrode 212 is formed over the principal surface of a semiconductor substrate 201 with a logic gate insulating film made of silicon oxide interposed therebetween. A sidewall insulating film 213 is formed on each of the respective side surfaces of the logic gate insulating film and the logic gate electrode 212. In the second active region 204, the impurity diffusion layers each serving as the source region or drain region are formed. The silicide layers 217 are formed on the respective upper surfaces of the logic gate electrode 212 and the impurity diffusion layers.

Thus, the logic transistor composed of a field-effect transistor is constituted by the logic gate insulating film, the logic gate electrode 212 having the silicide layer 217 formed on the upper portion thereof, and the impurity diffusion layers each having the silicide layer 217 formed on the upper portion thereof.

A method for fabricating the semiconductor memory device according to the second embodiment thus constituted will be described herein below with reference to the cross-sectional views of FIGS. 14A to 14C through FIGS. 19A to 19C which illustrate individual process steps in the order in which the fabrication process proceeds. Each of FIGS. 14A, 15A, 16A, 17A, 18A, and 19A shows a cross-sectional configuration of the portion corresponding to the line IXXa-IXXa of FIG. 13. Each of FIGS. 14B, 15B, 16B, 17B, 18B, and 19B shows a cross-sectional configuration of the portion corresponding to the line IXXb-IXXb of FIG. 13. Each of FIGS. 14C, 15C, 16C, 17C, 18C, and 19C shows a cross-sectional configuration of the portion corresponding to the line IXXc-IXXc of FIG. 13.

Figure 14A:
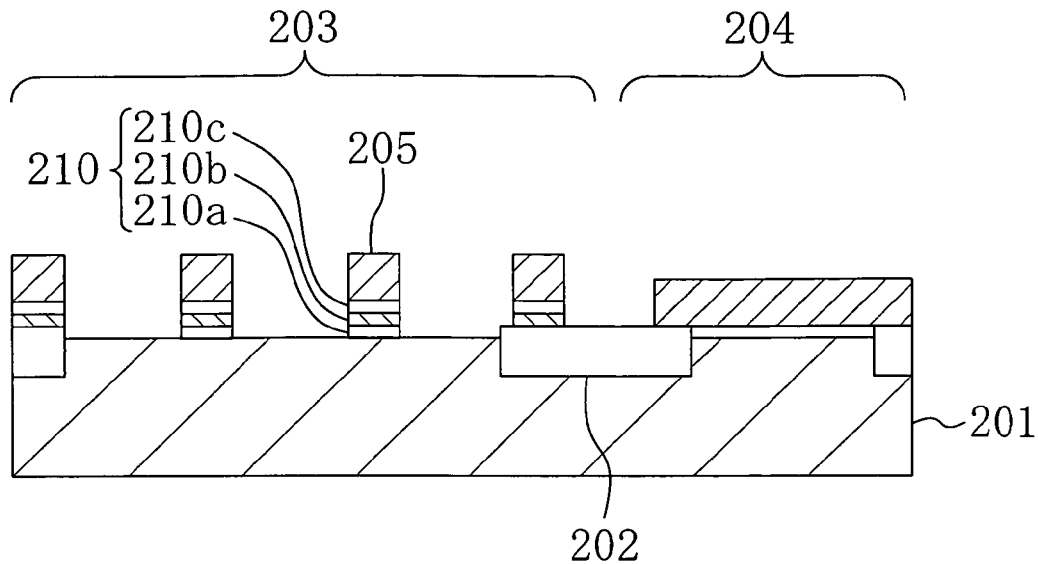
FIGS. 14A to 14C are cross-sectional views illustrating a process step of a method for fabricating the semiconductor memory device according to the second embodiment.
Figure 14B:
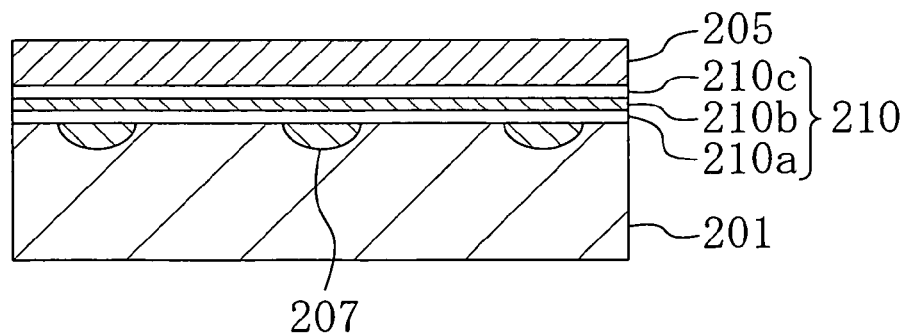
Figure 14C:
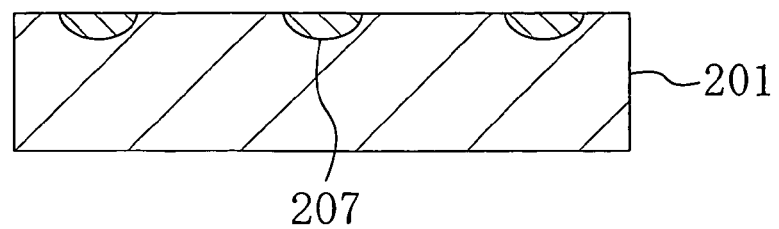

First, as shown in FIGS. 14A, 14B, and 14C, silicon oxide is buried in trenched portions each formed at a depth of about 300 nm in the upper portion of the semiconductor substrate 201 to form the isolation insulating film 202, whereby the first active region 203 as the memory region and the second active region 204 as the logic region are formed. Subsequently, impurity ions, e.g., arsenic ions are implanted at a dose of about $5 \times 10^{15}/cm^2$ into the specified portions of the first active region 203 with an acceleration voltage of about 50 KeV. Then, a thermal process in a nitrogen atmosphere at a temperature of, e.g., about 900° C. is performed for about 60 minutes with respect to the semiconductor substrate 200 into which the ions have been implanted to activate the implanted arsenic ions, whereby the plurality of impurity diffusion layers 207 serving as the source or drain regions of the memory transistors are formed in the directions in which the bit lines extend.

Subsequently, a lower-layer silicon oxide film having a thickness of 10 nm is formed by thermal oxidation on each of the first and second active regions 203 and 204 of the semiconductor substrate 201. Then, an intermediate-layer silicon nitride film having a thickness of 7 nm and an upper-layer silicon oxide film having a thickness of 10 nm are deposited successively by low-pressure CVD on the lower-layer silicon oxide film that has been formed. It is to be noted that the upper-layer silicon oxide film need not necessarily be formed Subsequently, the intermediate-layer silicon oxide film and the upper-layer silicon oxide film are removed selectively from the second active region 204 by using a well-known etching technology. Then, a polycrystalline silicon film as a silicon-containing film having a thickness of about 200 nm is deposited by low-pressure CVD on each of the first and second active regions 203 and 204. Subsequently, impurity ions, e.g., phosphorus ions are implanted at a dose of about $2 \times 10^{15}/cm^2$ into the deposited polycrystalline silicon films with an acceleration voltage of about 10 KeV. Thereafter, a thermal process in a nitrogen atmosphere at a temperature of, e.g., about 800° C. is performed for about 15 minutes with respect to the polycrystalline silicon films into which the ions have been implanted, thereby activating the implanted phosphorus ions.

Subsequently, in the first active region 203, the polycrystalline silicon film, the upper-layer silicon oxide film, the intermediate-layer silicon nitride film, and the lower-layer silicon oxide film are patterned successively by using well-known lithographic and etching technologies to form the memory gate electrodes 205 each composed of the polycrystalline silicon film and the memory gate insulating films 210 each constituted by a multilayer structure having the upper gate insulating film 210c composed of the upper-layer silicon oxide film, the charge accumulation film 210b composed of the intermediate-layer silicon nitride film, and the lower silicon oxide film 210a composed of the lower-layer silicon oxide film.

Figure 15A:
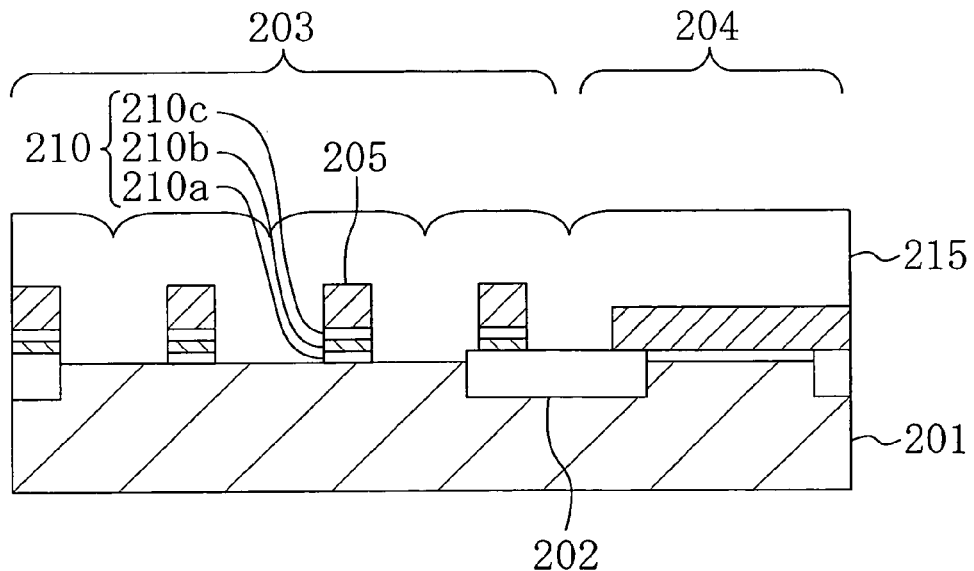
FIGS. 15A to 15C are cross-sectional views illustrating a process step of the method for fabricating the semiconductor memory device according to the second embodiment.
Figure 15B:
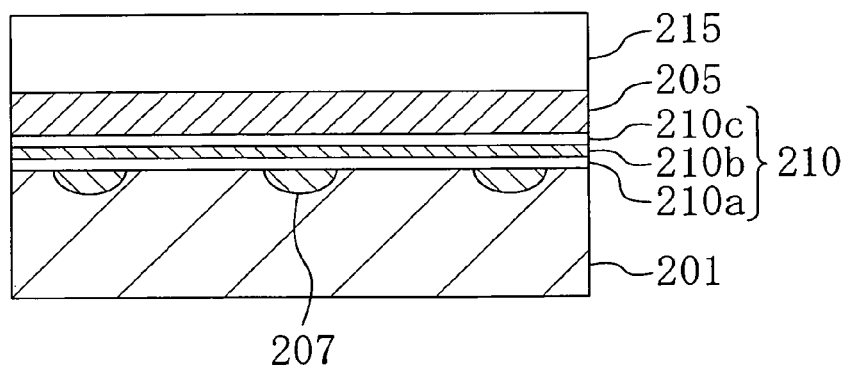
Figure 15C:
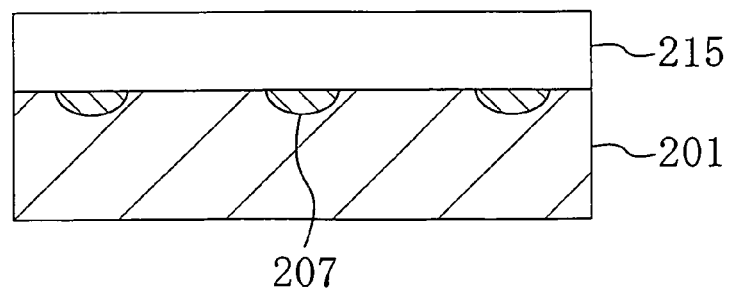

Next, as shown in FIGS. 15A, 15B, and 15C, an insulating film 215 composed of a silicon oxide film having a thickness of about 300 nm is deposited by plasma CVD over the entire surface of the semiconductor substrate 201 including the plurality of memory gate electrodes 205, a polycrystalline silicon film, and the isolation insulating film 202 in the first and second active regions 203 and 204.

Figure 16A:
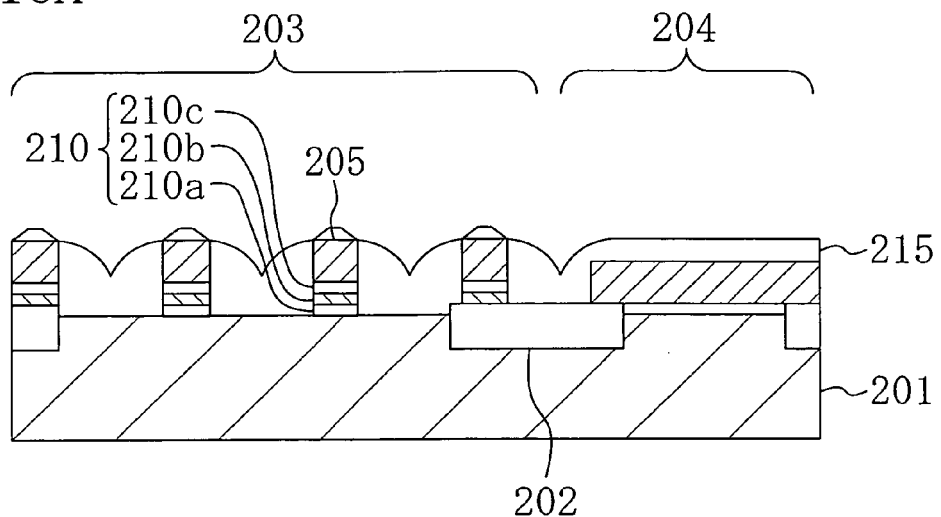
FIGS. 16A to 16C are cross-sectional views illustrating a process step of the method for fabricating the semiconductor memory device according to the second embodiment.
Figure 16B:
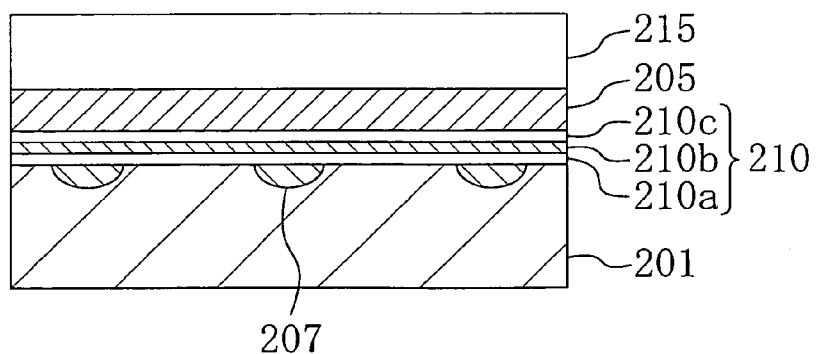
Figure 16C:
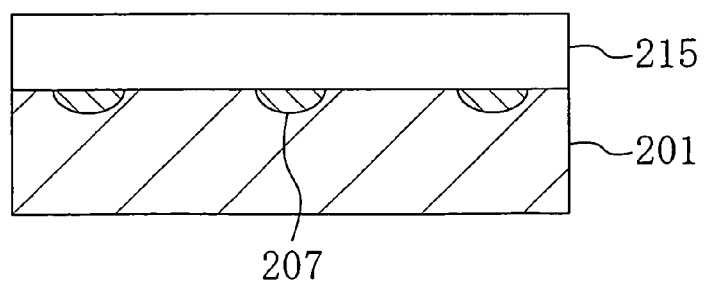

Next, as shown in FIGS. 16A, 16B, and 16C, anisotropic etching including an isotropic etching component is performed with respect to the insulating film 215, thereby exposing the edge portions of the upper surface of each of the memory gate electrodes 205 first. By way of example, the dry etching including an isotropic etching component is performed under such conditions that tetra fluorocarbon ($CF_4$) at a flow rate of 100 $cm^3$/min (at 0° C. and 1 atm) and oxygen ($O_2$) at a flow rate of 20 $cm^3$/min (at 0° C. and 1 atm) are used as etching gases, power is adjusted to 100 W, and the pressure in a chamber is adjusted to 50 Pa.

Figure 17A:
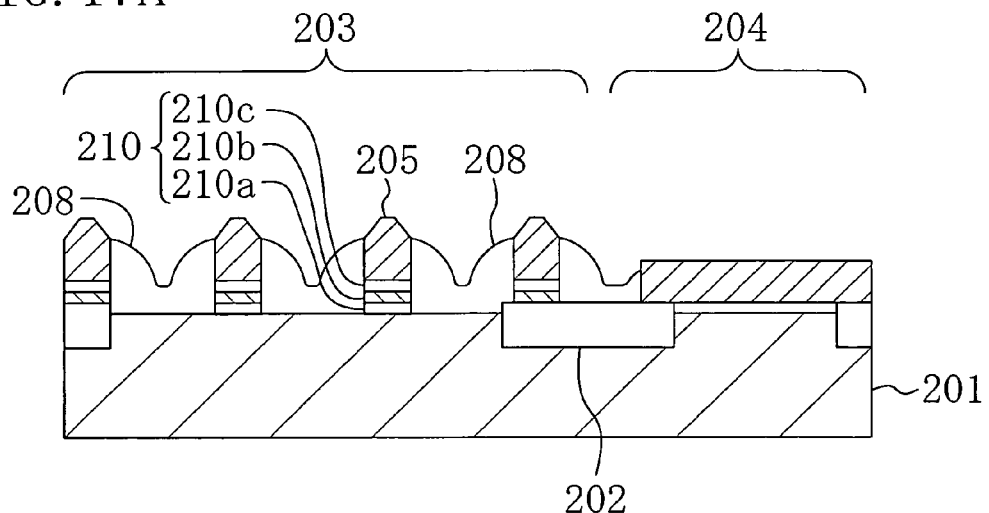
FIGS. 17A to 17C are cross-sectional views illustrating a process step of the method for fabricating the semiconductor memory device according to the second embodiment.
Figure 17B:
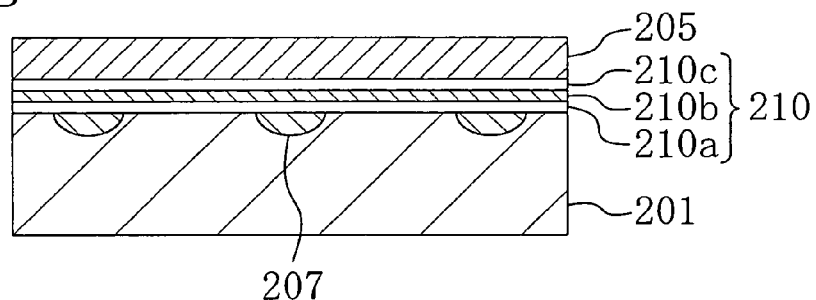
Figure 17C:
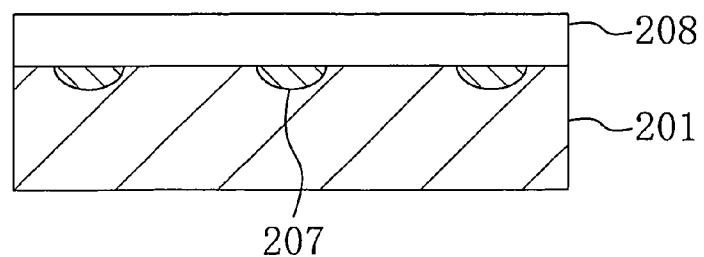

Next, as shown in FIGS. 17A, 17B, and 17C, an etching process is further performed under dry etching conditions including the lower etching selectivity between the polycrystalline silicon and the insulating film 215 made of silicon oxide, thereby exposing the upper surface of each of the memory gate electrodes 205, while etching each of the edge portions of the upper surfaces of the memory gate electrodes 105 into a tapered or rounded configuration by using an over-etching process. By way of example, the dry etching with the low etching selectivity may be performed appropriately by increasing the flow rate of oxygen among the foregoing etching conditions from 20 $cm^3$/min (at 0° C. and 1 atm) to 50 $cm^3$/min (at 0° C. and 1 atm).

It is to be noted that each of the edge portions of the upper surfaces of the memory gate electrodes 205 is not limited to a tapered or rounded configuration provided that etching is performed in such a manner as to form the upper surface of each of the memory gate electrodes 205 into a protruding portion which is higher in level at the middle portion than at the edge portions (peripheral portions). By the sequence of etching steps, the insulating film 215 is left as the memory inter-gate insulating films 208 on the regions of the principal surface of the semiconductor substrate 201 which are located between the plurality of memory gate electrodes 205.

Thus, the fabrication method according to the second embodiment performs anisotropic etching including an isotropic etching component, as shown in FIGS. 16A, 16B, and 16C, and thereby allows the edge portions of the upper surface of each of the memory gate electrodes 205 to be exposed before the middle portion thereof is exposed. As a result, the edge portions of the upper surface of the memory gate electrodes 205 are exposed to an etching gas for a longer period than the middle portion thereof, which allows the formation of each of the edge portions of the upper surfaces of the gate electrodes into a tapered or rounded configuration. Since the insulating film 215 exists between the adjacent memory gate electrodes 205 in the sequence of etching steps, the regions of the semiconductor substrate 201 which are located between the memory gate electrodes 205 are prevented from being grated by etching. Moreover, since the second active region 204 is covered with the polycrystalline silicon film in the sequence of etching steps, the portion of the semiconductor substrate 201 included in the second active region 204 and the isolation insulating film 202 are prevented from being grated by etching.

Figure 18A:
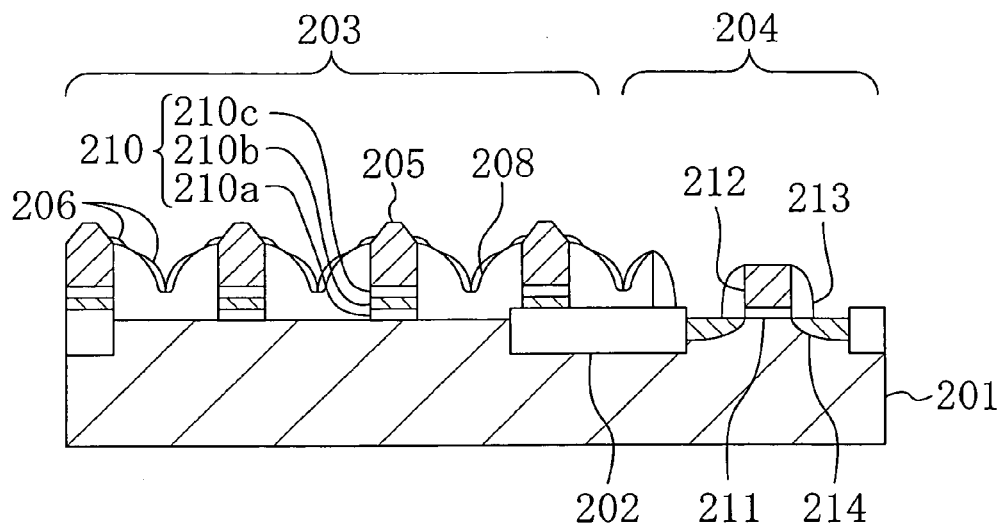
FIGS. 18A to 18C are cross-sectional views illustrating a process step of the method for fabricating the semiconductor memory device according to the second embodiment.
Figure 18B:
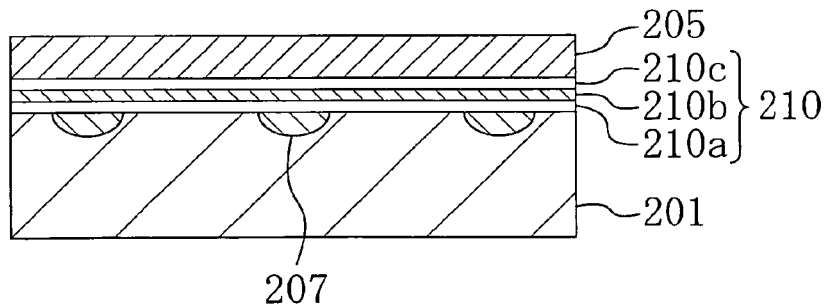
Figure 18C:
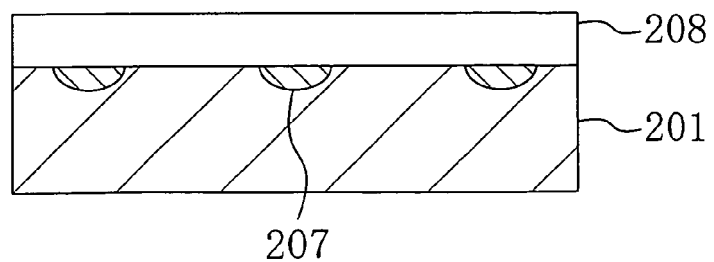

Next, as shown in FIGS. 18A, 18B, and 18C, the polycrystalline silicon film and the lower-layer silicon oxide film are patterned successively in the second active region 204 so that the logic electrode 212 composed of the polycrystalline silicon film and a logic gate insulating film 211 composed of the lower-layer silicon oxide film are formed. Subsequently, a silicon oxide film for forming sidewall insulating films having a thickness of about 100 nm is deposited by low-pressure CVD over the entire surface including the plurality of memory gate electrodes 215, the logic gate electrode, and the isolation insulating film 202 in each of the first and second active regions 203 and 204. At this time, the thickness of the portion of the silicon oxide film which is deposited on each of the edge portions (tapered portions) of the upper surface of each of the memory gate electrodes 205 having the upper portions thereof each formed into a protruding configuration, such as a tapered configuration, is equal to the thickness of the portion of the silicon oxide film which is deposited on the middle portion of the upper surface of the memory gate electrode 205.

Subsequently, an etch-back process corresponding to a depth of about 110 nm is performed with respect to the deposited silicon oxide film, thereby forming the sidewall insulating film 213 on each of the side surfaces of the logic gate electrode 212. As a result, the silicon oxide film for forming the sidewall insulating film 213 is etched without remaining on the tapered portions of the upper surface of each of the memory gate electrodes 205 in the first active region 203 so that the upper portion of the memory gate electrode 205 is exposed. On the other hand, an extremely small sidewall insulating film 206 remains on each of the memory inter-gate insulating films 208 between those of the memory gate electrodes 205 which are adjacent to each other.

By thus forming each of the edge portions of the upper surfaces of the memory gate electrodes 205 into a tapered or rounded configuration, the silicon oxide film for forming the sidewall insulating film 213 on the logic gate electrode 212 is removed by the etch-back process from the edge portions (peripheral portions) of the upper surface of each of the memory gate electrodes 205. As a result, the sidewall insulating films 206 are prevented from being formed on the edge portions (peripheral portions) of the upper surface of each of the memory gate electrodes 205 during the formation of the sidewall insulating film 213.

Subsequently, impurity ions, e.g., arsenic ions are implanted into the semiconductor substrate 201 in the second active region 204 by using the logic gate electrode 212 and the sidewall insulating film 213 as a mask and then a specified thermal process for activating the implanted impurity ions is performed to form the impurity diffusion layer 214 serving as the source region or drain region.

Figure 19A:
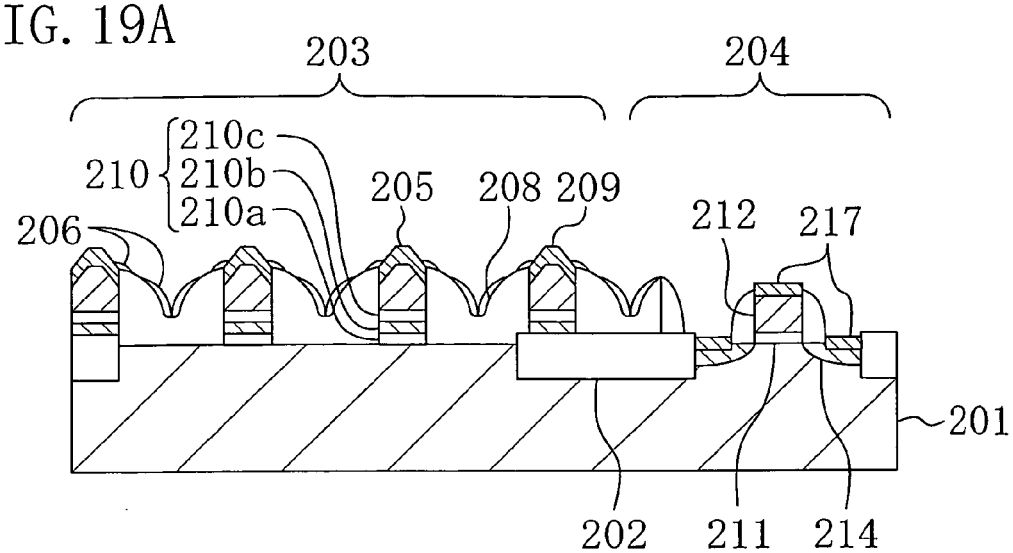
FIGS. 19A to 19C are cross-sectional views illustrating a process step of the method for fabricating the semiconductor memory device according to the second embodiment.
Figure 19B:
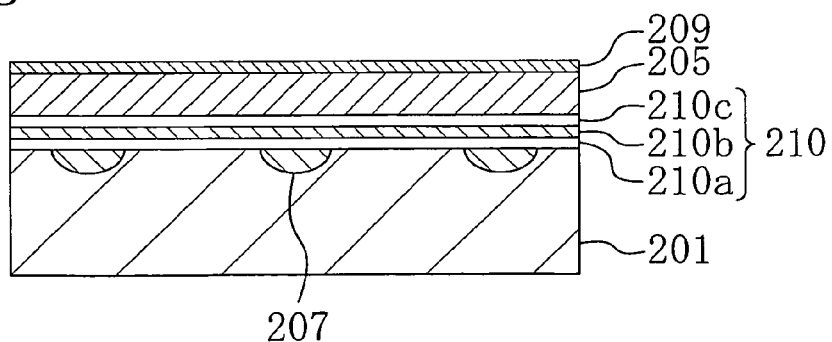
Figure 19C:
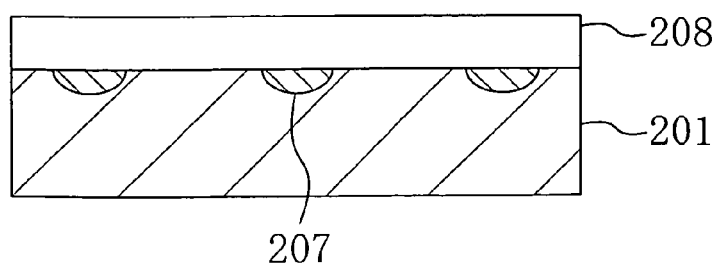

Next, as shown in FIGS. 19A, 19B, and 19C, the silicide layer 209 is formed by using a salicide technology on the tapered or rounded upper surface as the protruding portion of each of the memory gate electrodes 205 including the edge portions in the first active region 203. At the same time, the silicide layer 217 is formed on each of the upper surface of the logic gate electrode 212 and the upper surface of the impurity diffusion layer 214 in the second active region 204.

By the process described above, the semiconductor memory device according to the second embodiment can be obtained. Since a metal wiring step, a protection-film forming step, a bonding-pad forming step, and the like which are performed subsequently are well known, the description thereof will be omitted.

As described above, the second embodiment allows easy formation of the silicide layer 209 on each of the memory gate electrodes 205 such that the length of the silicide layer 209 in the gate width direction is larger than the width of the gate by forming the upper surface of each of the memory gate electrodes 205 into the protruding portion having the upwardly protruding middle portion in the first active region 203 as the memory region and then forming the silicide layer 209 on the protruding portion. As a result, the contact area of the silicide layer 209 per unit length of the gate electrode increases and the resistance value per unit length of the memory gate electrode 205 (bar resistance) can be reduced. This allows the memory transistor to satisfy the requirements for further miniaturization and higher-speed operation.

Variation 1 of Embodiment 2

Figure 20A:
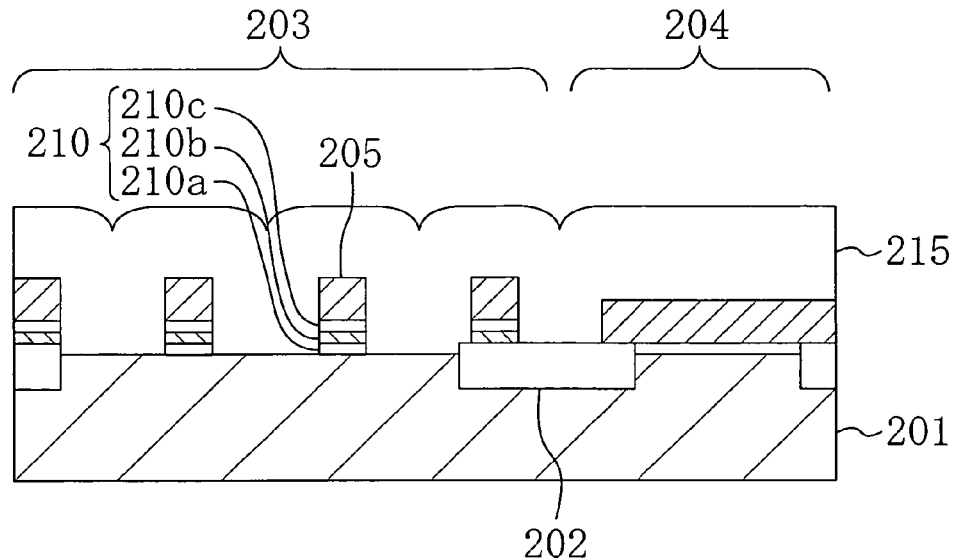
FIGS. 20A to 20C are cross-sectional views illustrating a process step of a method for fabricating a semiconductor memory device according to a first variation of the second embodiment.
Figure 20B:
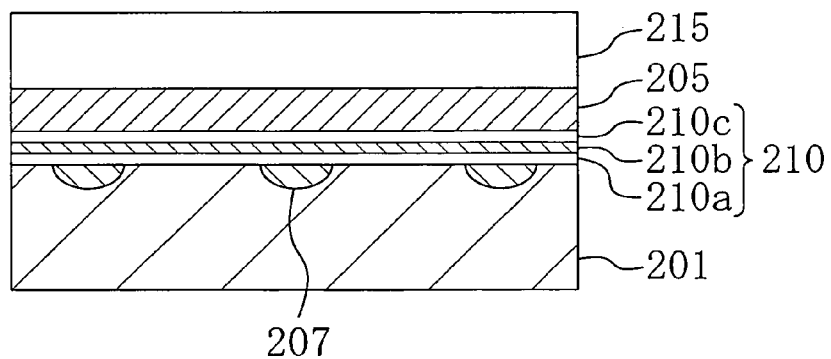
Figure 20C:
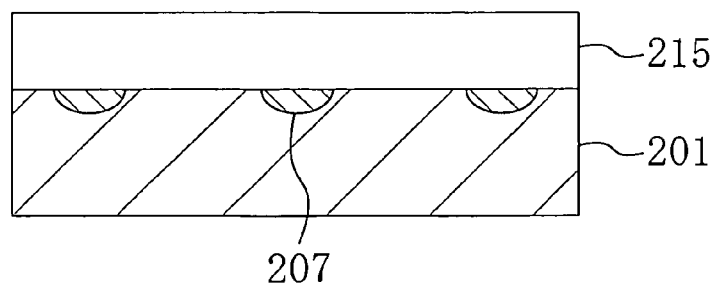

Referring to FIGS. 20A to 20C, a description will be given herein below to a method for fabricating a semiconductor memory device according to a first variation of the second embodiment of the present invention.

In contrast to the fabrication method according to the second embodiment which has used the anisotropic dry etching process including an isotropic etching component as the etching process for selectively exposing the edge portions of the upper surface of each of the memory gate electrodes 205 shown in FIGS. 16A to 16C, the first variation performs isotropic etching and thereby forms the insulating film 215 such that it is thinner at the portions thereof in the vicinity of the edge portions of the upper surface of the memory gate electrode 205 than at the middle portion thereof.

Specifically, as shown in FIGS. 20A, 20B, and 20C, wet etching using, e.g., a diluted hydrofluoric acid solution is performed with respect to the insulating film 215 made of silicon oxide to form the insulating film 215 such that the portion of the insulating film 215 overlying each of the memory gate electrodes 205 is thinner over each of the edge portions (peripheral portions) of the memory gate electrode 205 than over the middle portion thereof.

Thereafter, anisotropic dry etching is performed to form the upper portion of each of the memory gate electrodes 205 into a tapered or rounded protruding configuration, as shown in FIGS. 17A, 17B, and 17C.

Variation 2 of Embodiment 2

Figure 21A:
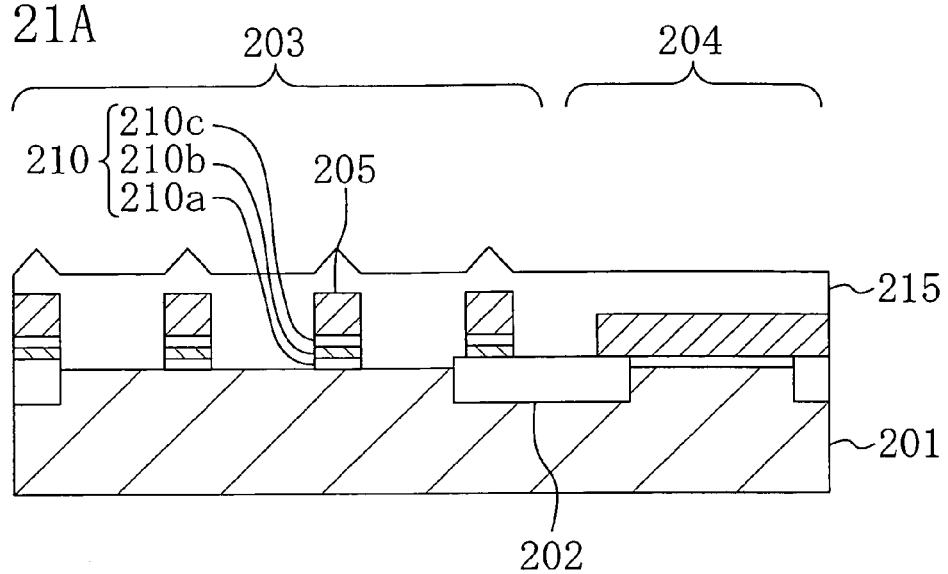
FIGS. 21A to 21C are cross-sectional views illustrating a process step of a method for fabricating a semiconductor memory device according to a second variation of the second embodiment
Figure 21B:
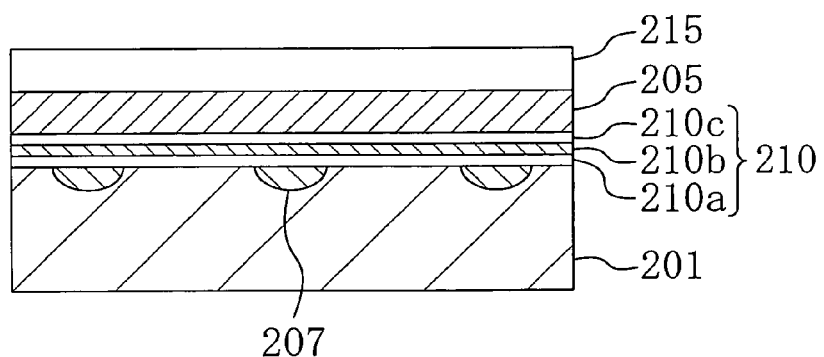
Figure 21C:
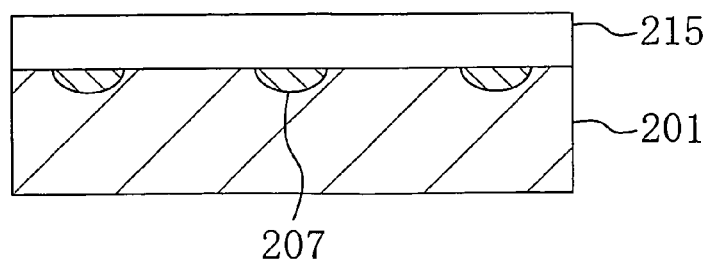

Referring to FIGS. 21A to 21C, a description will be given herein below to a method for fabricating a semiconductor memory device according to a second variation of the second embodiment of the present invention.

In contrast to the fabrication method according to the second embodiment which has used the atmospheric-pressure CVD as the deposition method for the insulating film 215 shown in FIGS. 15A to 15C, the fabrication method according to the second variation uses a reverse sputtering process such as argon sputtering.

Specifically, as shown in FIG. 15A, 15B, and 15C, when the insulating film 215 made of silicon oxide is deposited by using a sputtering technology which covers the surface (target surface) of a target material made of silicon oxide for a proper period of time to perform so-called reverse sputtering, the insulating film 215 having a configuration which is thinner over the edge portions of the upper surface of each of the memory gate electrodes 205 than over the middle portion thereof can be formed.

As a result, the edge portions of the upper surface of each of the memory gate electrodes 205 can be exposed more easily in the subsequent etching step shown in FIGS. 16A to 16C. This allows the upper surface of each of the memory gate electrodes 205 to be exposed and each of the edge portions thereof to be etched easily into a tapered or rounded configuration as shown in FIGS. 17A to 17C.

The second embodiment has performed the etching step for forming the memory inter-gate insulating films 208 shown in FIGS. 16A to 16C and 17A to 17C, i.e., the step of forming the upper surface of each of the memory gate electrodes 205 into the protruding portion under such conditions that the polycrystalline silicon film can also be etched simultaneously with the insulating film 215 made of silicon oxide and an etch rate for the polycrystalline silicon film is lower than an etch rate for the silicon oxide film. Accordingly, each of the edge portions of the upper surfaces of the memory gate electrodes 205 that has been exposed can be formed more effectively into a tapered configuration, as shown in FIGS. 16A to 16C.

Although the second embodiment has described the case where each of the memory elements formed in the first active region 203 is of the type which traps charge in the memory gate insulating film 210, it may also be of a type which has a floating gate electrode provided between the gate insulating film 210 and the gate electrode 205 and traps charge in the provided floated gate electrode.

In the second embodiment, if the step of depositing the insulating film 215 shown in FIG. 15 through the step of removing the insulating film 215 to expose the upper surface of each of the memory gate electrodes 205 and removing the edge portions of the upper surface of the memory gate electrode 205 shown in FIG. 17 are performed repeatedly, the tapered or rounded portion of each of the edge portions of the upper surface of the memory gate electrode 205 can be increased in size. This allows the area of the silicide layer 209 to be increased more effectively.

Thus, the semiconductor memory device and the fabrication method therefor according to the present invention allow the region of the silicide layer which is in contact with the upper surface of each of the gate electrodes to have a length in the gate width direction which is larger than the gate width so that the area of the silicide layer in the cross section of the gate electrode is larger than in the case where the upper surface of the gate electrode is flat. As a result, the resistance value per unit length of the gate electrode (bar resistance) is reduced and the memory transistor can satisfy the requirements for further miniaturization and higher-speed operation. Therefore, the semiconductor memory device and the fabrication method therefor according to the present invention are useful as a semiconductor memory device in which a logic region and a memory region having a diffusion wiring layer structure are embedded and a fabrication method therefor.

What is claimed is:

1. A semiconductor memory device comprising a memory region in which a plurality of memory cells each including a memory transistor are arranged as a matrix using a plurality of bit lines and a plurality of word lines intersecting each other, wherein a gate electrode of each of the memory transistors has in the upper portion an upper surface thereof formed into a protruding portion which is higher in level at a middle portion than at an edge portion, and the upper surface of the protruding portion comprises a middle flat portion and a portion having a substantially linearly tapered configuration extending from the flat portion to the edge portion, and a silicide layer is formed on an upper surface of the protruding portion of the gate electrode of the memory transistor.

2. The semiconductor memory device of claim 1, wherein each of the memory transistors has an impurity diffusion layer serving as a source region or drain region and also constituting a part of the corresponding one of the bit lines and has the gate electrode constituting a part of the corresponding one of the word lines.

3. The semiconductor memory device of claim 1, wherein an inter-gate insulating film is formed on a region of the substrate which is located between the respective gate electrodes of the plurality of memory transistors.

4. The semiconductor memory device of claim 1, further comprising:
   a logic region formed on a region of the substrate other than the memory region and in which a logic transistor is disposed, wherein
   a sidewall insulating film is formed on each side surface of a gate electrode of the logic transistor.

5. The semiconductor memory device of claim 4, wherein a silicide layer is formed on each of an upper surface of the gate electrode of the logic transistor and an exposed portion of an impurity diffusion layer serving as a source region or drain region of the logic transistor.

6. The semiconductor memory device of claim 1, wherein each of the memory transistors has a memory gate insulating film formed under the gate electrode and the memory gate insulating film has a charge accumulation film.

7. The semiconductor memory device of claim 6, wherein
   the memory gate insulating film is composed of a multilayer structure having a lower-layer silicon oxide film and an upper-layer silicon nitride film and
   the charge accumulation film is composed of the upper-layer silicon nitride film.

8. The semiconductor memory device of claim 6, wherein
   the memory gate insulating film is composed of a multilayer structure having a lower-layer silicon oxide film, an intermediate-layer silicon nitride film, and a upper-layer silicon oxide film and
   the charge accumulation film is composed of the intermediate-layer silicon nitride film.

9. The semiconductor memory device of claim 1, wherein
   each of the memory transistors has a memory gate insulating film formed under the gate electrode and the memory gate insulating film is composed of a multilayer structure having a lower-layer silicon oxide film, an intermediate-layer silicon nitride film, and an upper-layer silicon oxide film and
   the intermediate-layer silicon nitride film is formed as a common intermediate-layer silicon nitride film connecting the respective memory gate insulating films of the plurality of memory transistors to each other.

10. The semiconductor memory device of claim 2, wherein, of the plurality of memory transistors, each pair adjacent to each other in a direction in which each of the word lines extends share the common impurity diffusion layer serving as the source region of one of the adjacent pair of memory transistors and also as the drain region of the other thereof.

11. The semiconductor memory device of claim 5, wherein the silicide layer on the gate electrode of each of the memory transistors and the silicide layer on the gate electrode of the logic transistor have different cross-sectional configurations in a direction perpendicular to a surface of the substrate.

* * * * *